(12) United States Patent
Ishibashi

(10) Patent No.: US 11,145,488 B2
(45) Date of Patent: Oct. 12, 2021

(54) ION IMPLANTER AND ION IMPLANTATION METHOD

(71) Applicant: SUMITOMO HEAVY INDUSTRIES ION TECHNOLOGY CO., LTD., Tokyo (JP)

(72) Inventor: Kazuhisa Ishibashi, Ehime (JP)

(73) Assignee: SUMITOMO HEAVY INDUSTRIES ION TECHNOLOGY CO., LTD., Tokyo (JP)

(*) Notice: Subject to any disclaimer, the term of this patent is extended or adjusted under 35 U.S.C. 154(b) by 0 days.

(21) Appl. No.: 16/987,799

(22) Filed: Aug. 7, 2020

(65) Prior Publication Data

US 2021/0043421 A1    Feb. 11, 2021

(30) Foreign Application Priority Data

Aug. 7, 2019  (JP) .............................. JP2019-145266

(51) Int. Cl.
*H01J 37/317*    (2006.01)
*H01J 37/304*    (2006.01)

(52) U.S. Cl.
CPC ........ *H01J 37/3171* (2013.01); *H01J 37/304* (2013.01); *H01J 2237/20228* (2013.01); *H01J 2237/30483* (2013.01); *H01J 2237/31703* (2013.01)

(58) Field of Classification Search
CPC ............... H01J 37/3023; H01J 37/3026; H01J 37/3171; H01J 37/304; H01J 37/2237; H01J 37/20228; H01J 37/3084; H01J 37/31703

See application file for complete search history.

(56) References Cited

U.S. PATENT DOCUMENTS

| | | | |
|---|---|---|---|
| 8,772,142 B2 | 7/2014 | Ninomiya et al. | |
| 8,772,741 B2 | 7/2014 | Ninomiya et al. | |
| 9,165,772 B2 | 10/2015 | Ninomiya et al. | |
| 9,601,314 B2 | 3/2017 | Ninomiya et al. | |
| 9,905,397 B2* | 2/2018 | Ninomiya | H01J 37/304 |
| 9,984,856 B2 | 5/2018 | Ninomiya et al. | |

(Continued)

FOREIGN PATENT DOCUMENTS

| | | |
|---|---|---|
| JP | 5575025 B | 8/2014 |
| JP | 5638995 B | 12/2014 |

(Continued)

*Primary Examiner* — David E Smith
(74) *Attorney, Agent, or Firm* — Michael Best & Friedrich LLP

(57) ABSTRACT

An ion implanter includes a beam generator that generates anion beam, a beam scanner that performs reciprocating scan with the ion beam in a first direction, a platen driving device that performs reciprocating motion of a wafer in a second direction perpendicular to the first direction, while holding the wafer so that a wafer processing surface is irradiated with the ion beam subject to the reciprocating scan, and a control device that changes a beam scan speed in the first direction and a wafer motion speed in the second direction in accordance with a beam irradiation position in the first direction and the second direction at which the wafer processing surface is irradiated with the ion beam so that ions having a desired two-dimensional non-uniform dose distribution are implanted into the wafer processing surface.

17 Claims, 11 Drawing Sheets

(56) References Cited

U.S. PATENT DOCUMENTS

| | | |
|---|---|---|
| 10,217,607 B2 | 2/2019 | Ishibashi et al. |
| 2006/0057303 A1* | 3/2006 | Agarwal ............... H01J 37/304 427/523 |
| 2008/0067434 A1* | 3/2008 | Walther .............. H01J 37/3026 250/492.21 |
| 2016/0312357 A1* | 10/2016 | Gammel ............. H01J 37/3171 |
| 2017/0148633 A1 | 5/2017 | Ninomiya et al. |

FOREIGN PATENT DOCUMENTS

| | | |
|---|---|---|
| JP | 5718169 B | 5/2015 |
| JP | 2017-069055 A | 4/2017 |
| JP | 2017-174506 A | 9/2017 |
| JP | 2018-041595 A | 3/2018 |

* cited by examiner

| REGION NO. | RANGE X (mm) | | RANGE Y (mm) | | CORRECTION FUNCTION | CORRECTION COEFFICIENT |
| --- | --- | --- | --- | --- | --- | --- |
| | LEFT POSITION | RIGHT POSITION | LOWER POSITION | UPPER POSITION | | |
| 1 | −20 | +20 | +145 | +155 | A | 0.51 |
| 2 | −50 | +50 | +135 | +145 | B | 0.67 |
| 3 | −75 | +75 | +125 | +135 | B | 0.84 |
| 4 | −90 | +90 | +115 | +125 | C | 1.03 |
| 5 | −100 | +100 | +105 | +115 | D | 1.29 |
| ⋮ | ⋮ | ⋮ | ⋮ | ⋮ | ⋮ | ⋮ |
| 16 | −150 | +150 | −5 | +5 | C | 2.15 |
| ⋮ | ⋮ | ⋮ | ⋮ | ⋮ | ⋮ | ⋮ |
| 31 | −20 | +20 | −155 | −145 | A | 0.42 |

$$\alpha = \sqrt{\frac{\int_{x_{21}}^{x_{22}}[f_1(x) - f_2(x)]^2 dx}{x_{22} - x_{21}}}$$

$$g(x) = \begin{cases} f_1(x) & (x_{11} \leq x < x_{21}) \\ [f_1(x) + f_2(x)]/2 & (x_{21} \leq x \leq x_{22}) \\ f_1(x) & (x_{22} < x \leq x_{12}) \end{cases}$$

ION IMPLANTER AND ION IMPLANTATION METHOD

RELATED APPLICATIONS

The content of Japanese Patent Application No. 2019-145266, on the basis of which priority benefits are claimed in an accompanying application data sheet, is in its entirety incorporated here by reference.

BACKGROUND

Technical Field

Certain embodiments of the present invention relate to an ion implanter and an ion implantation method.

Description of Related Art

In a semiconductor device manufacturing process, a process of implanting ions into a semiconductor wafer (also referred to as an ion implantation process) is generally performed in order to change conductivity of a semiconductor, or in order to change a crystal structure of the semiconductor. The apparatus used for the ion implantation process is called an ion implanter. In the ion implantation process, in some cases, "non-uniform implantation" may be required in order to intentionally provide non-uniformity for a two-dimensional dose distribution on a wafer processing surface. For example, a beam scan speed in a first direction and a wafer motion speed in a second direction are changed in accordance with a beam irradiation position in the first direction and the second direction where the wafer processing surface is irradiated with an ion beam. In this manner, desired non-uniform implantation is realized using the ion implanter in the related art.

SUMMARY

According to an aspect of the present invention, there is provided an ion implanter including a beam generator that generates an ion beam, a beam scanner that performs reciprocating scan with the ion beam in the first direction, a platen driving device that performs reciprocating motion of a wafer in a second direction perpendicular to the first direction, while holding the wafer so that a wafer processing surface is irradiated with the ion beam subject to the reciprocating scan, and a control device that changes a beam scan speed in the first direction and a wafer motion speed in the second direction in accordance with a beam irradiation position in the first direction and the second direction at which the wafer processing surface is irradiated with the ion beam so that ions having a desired two-dimensional non-uniform dose distribution are implanted into the wafer processing surface. The control device stores a plurality of implantation recipes, and each of the plurality of recipes includes a two-dimensional non-uniform dose distribution on the wafer processing surface, a plurality of correction functions determined based on a plurality of one-dimensional dose distributions in the first direction at a plurality of positions different in the second direction on the wafer processing surface, and correlation information associating the two-dimensional non-uniform dose distribution and the plurality of correction functions with each other. In a case where the control device acquires a target pattern of the two-dimensional non-uniform dose distribution, the control device identifies the implantation recipe including the two-dimensional non-uniform dose distribution similar to the target pattern, from the plurality of implantation recipes. Based on the plurality of correction functions and the correlation information which are included in the identified implantation recipe, the control device changes the beam scan speed in the first direction and the wafer motion speed in the second direction, and implants the ions having the two-dimensional non-uniform dose distribution similar to the target pattern, into the wafer processing surface.

According to another aspect of the present invention, there is provided an ion implantation method using the ion implanter according to the aspect. The ion implantation method includes acquiring a target pattern of the two-dimensional non-uniform dose distribution on the wafer processing surface, identifying the implantation recipe including the two-dimensional non-uniform dose distribution similar to the target pattern from the plurality of implantation recipes, and changing the beam scan speed in the first direction and the wafer motion speed in the second direction, and implanting the ions having the two-dimensional non-uniform dose distribution similar to the target pattern, into the wafer processing surface, based on the plurality of correction functions and the correlation information which are included in the identified implantation recipe.

DETAILED DESCRIPTION

Figure 1:
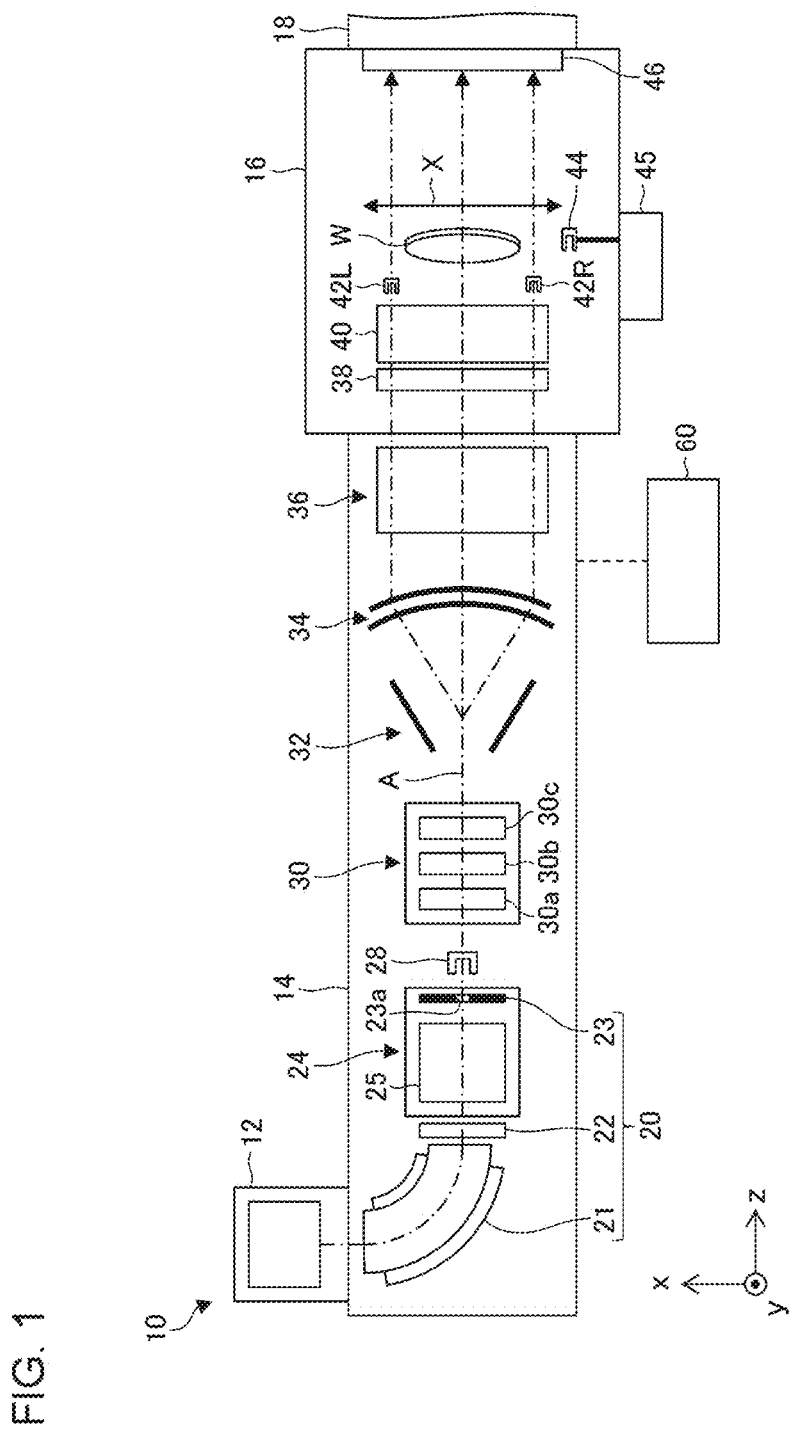
FIG. 1 is a top view illustrating a schematic configuration of an ion implanter according to an embodiment.

For example, the above-described non-uniform implantation is performed to correct variations in characteristics of semiconductor devices, which occur in a semiconductor device manufacturing process other than the ion implantation process, and can greatly contribute to improving a yield of the semiconductor devices. However, the two-dimensional non-uniform dose distribution to be a target pattern may vary in every wafer or every lot. Accordingly, it is necessary to individually prepare a data set for controlling the beam scan speed and the wafer motion speed in accordance with the target pattern. It is also necessary to actually perform an ion implantation by using the prepared data set, to measure the two-dimensional non-uniform dose distribution formed on a wafer surface, and to finely adjust the data set, based on a measured pattern. Preparing and adjusting the data set are complicated, and need much labor. Consequently, a heavy burden is imposed on a user of the ion implanter, thereby resulting in degraded productivity of the ion implanter.

It is desirable to provide a technique for improving the productivity of the ion implanter by reducing the burden on the user who wants to realize desired non-uniform implantation using the ion implanter.

Any desired combination of the above-described configuration elements, and those in which the configuration elements or expressions according to the present invention are substituted from each other in methods, devices, or systems are effectively applicable as an aspect of the present invention.

According to the embodiments of the present invention, the productivity of the ion implanter can be improved by reducing the burden on the user who wants to realize the desired non-uniform implantation using the ion implanter.

Hereinafter, embodiments according to the present invention will be described in detail with reference to the drawings. In describing the drawings, the same reference numerals will be assigned to the same elements, and repeated description will be appropriately omitted. Configurations described below are merely examples, and do not limit the scope of the present invention in any way.

Before the embodiments are described in detail, an outline will be described. The present embodiment relates to an ion implanter configured to implant ions having a desired two-dimensional non-uniform dose distribution into a wafer. For example, "non-uniform implantation" which intentionally provides non-uniformity for a two-dimensional dose distribution on a wafer processing surface is performed to correct variations in characteristics of semiconductor devices, which occur in a semiconductor device manufacturing process other than an ion implantation process. A dose is intentionally changed in accordance with the variations in the characteristics of the semiconductor devices on the wafer processing surface. In this manner, a yield of the semiconductor devices can be greatly improved. The non-uniform implantation is realized by a variable beam scan speed in a first direction (for example, an x-direction) and a variable wafer motion speed in a second direction (for example, a y-direction).

Data sets for controlling the beam scan speed and the wafer motion speed need to be individually prepared in accordance with a two-dimensional non-uniform dose distribution serving as a target pattern. In order to realize an intended two-dimensional non-uniform dose distribution with high accuracy, an ion implantation is actually performed using the prepared data set, and the two-dimensional non-uniform dose distribution formed on a wafer surface is actually measured. In addition, it is necessary to finely adjust the data set, based on a measured pattern. Preparing and adjusting the data set are complicated, and need much labor. Consequently, a heavy burden is imposed on a user of the ion implanter, thereby resulting in degraded productivity of the ion implanter. Furthermore, the two-dimensional non-uniform dose distribution serving as the target pattern may vary in every wafer or every lot depending on the variations in the characteristics of the semiconductor device to be corrected. However, it is not easy to prepare the data set for every wafer or every lot.

Therefore, according to the present embodiment, the data sets used in the past are accumulated, and the data set that can realize the two-dimensional non-uniform dose distribution similar to the target pattern is searched for and used again. In this manner, work for preparing a new data set is omitted. Here, a term of "similar" means that an index of similarity determined based on a predetermined calculation satisfies a predetermined condition. Conversely, a term of "not similar" means that the index of the similarity determined based on the predetermined calculation does not satisfy the predetermined condition. Even in a case where the data set capable of realizing the similar two-dimensional non-uniform dose distribution is not accumulated, the data set is automatically prepared. In this manner, it is possible to reduce the work for preparing the new data set. In this way, a burden in preparing the data set is reduced. Accordingly, proper non-uniform implantation can be performed for every wafer or every lot. An operation time of the ion implanter for preparing and adjusting the data set can be reduced. Therefore, productivity of the ion implanter can be improved.

Figure 2:
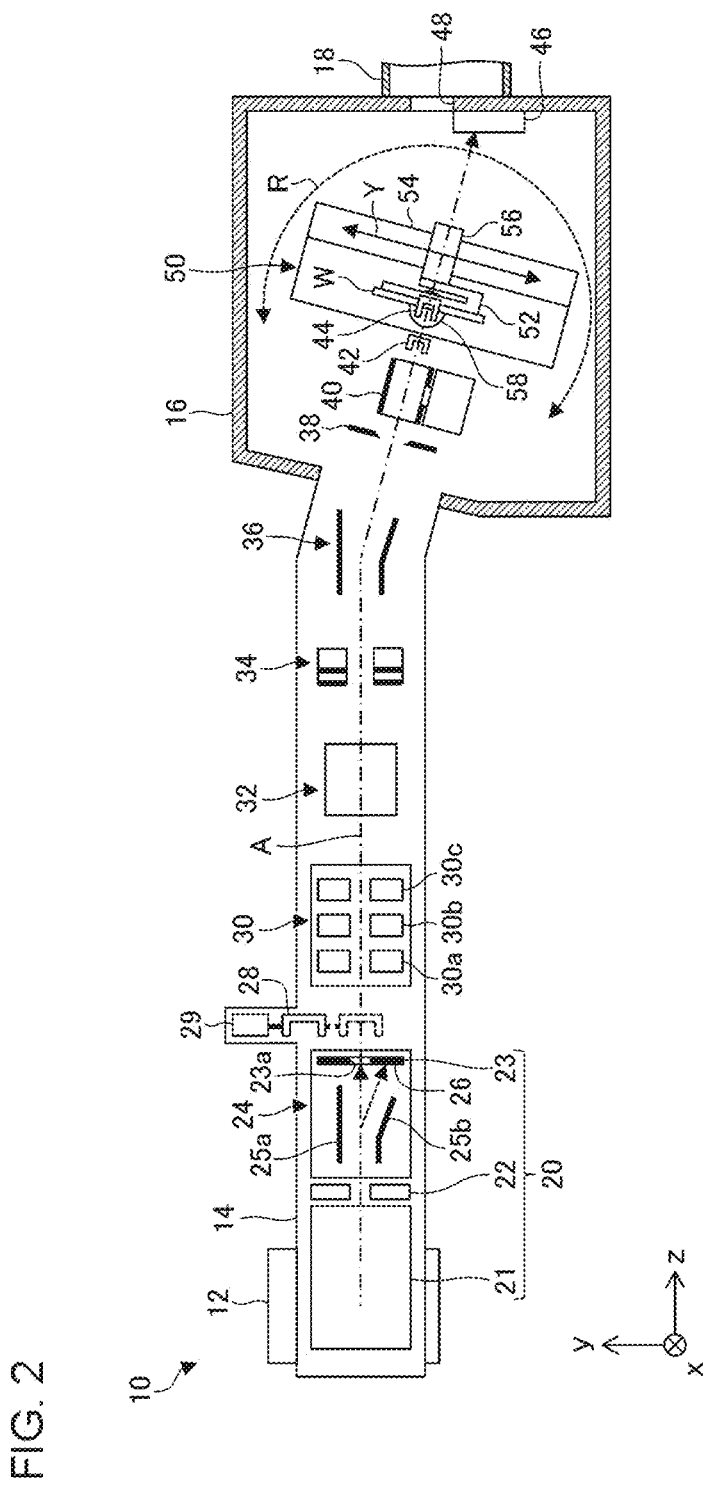
FIG. 2 is a side view illustrating a schematic configuration of the ion implanter in FIG. 1.

FIG. 1 is a top view schematically illustrating an ion implanter 10 according to an embodiment, and FIG. 2 is a side view illustrating a schematic configuration of the ion implanter 10. The ion implanter 10 is configured to perform an ion implantation process on a surface of a workpiece W. For example, the workpiece W is a substrate, or is a semiconductor wafer. For convenience of description, the workpiece W may be referred to as a wafer W in the specification herein. However, this is not intended to limit an implantation processing target to a specific object.

The ion implanter 10 is configured to irradiate a whole processing surface of the wafer W with the ion beam by performing reciprocating scan using the ion beam in one direction and causing the wafer W to reciprocate in a direction perpendicular to the scanning direction. In the specification herein, for convenience of description, a traveling direction of the ion beam traveling along a designed beamline A is defined as a z-direction, and a plane perpendicular to the z-direction is defined as an xy-plane. In a case where the workpiece W is canned with the ion beam, the scanning direction of the beam is defined as an x-direction, and a direction perpendicular to the z-direction and the x-direction is defined as a y-direction. Therefore, the reciprocating scan using the ion beam is performed in the x-direction, and a reciprocating motion of the wafer W is performed in the y-direction.

The ion implanter 10 includes an ion generator 12, a beamline device 14, an implantation processing chamber 16, and a wafer transfer device 18. The ion generator 12 is configured to provide the ion beam for the beamline device 14. The beamline device 14 is configured to transport the ion beam from the ion generator 12 to the implantation processing chamber 16. The implantation processing chamber 16 accommodates the wafer W serving as an implantation target, and an implantation process of irradiating the wafer W with the ion beam provided from the beamline device 14 is performed in the implantation processing chamber 16. The wafer transfer device 18 is configured to load an unprocessed wafer before the implantation process into the implantation processing chamber 16, and unload a processed wafer after the implantation process from the implantation processing chamber 16. The ion implanter 10 includes a vacuum system (not illustrated) for providing a desired vacuum environment for the ion generator 12, the beamline device 14, the implantation processing chamber 16, and the wafer transfer device 18.

The beamline device 14 includes a mass analyzing unit 20, a beam park device 24, a beam shaping unit 30, a beam scanning unit 32, a beam parallelizing unit 34, and an angular energy filter (AEF) 36, in order from an upstream side of a beamline A. The upstream side of the beamline A means a region closer to the ion generator 12, and a downstream side of the beamline A means a region closer to the implantation processing chamber 16 (ora beam stopper 46).

The mass analyzing unit 20 is disposed downstream of the ion generator 12, and is configured to select a required ion species from the ion beam extracted from the ion generator 12 by performing mass analyzing. The mass analyzing unit 20 has amass analyzing magnet 21, amass analyzing lens 22, and a mass analyzing slit 23.

The mass analyzing magnet 21 applies a magnetic field to the ion beam extracted from the ion generator 12, and deflects the ion beam to travel in a specific path in accordance with a value of the mass-to-charge ratio M=m/q (here, m is mass, and q is charge). For example, the mass analyzing magnet 21 applies the magnetic field in the y-direction (−y-direction in FIGS. 1 and 2) to the ion beam so that the ion beam is deflected in the x-direction. Strength of the magnetic field of the mass analyzing magnet 21 is adjusted so that the ion species having a desired mass-to-charge ratio M passes through the mass analyzing slit 23.

The mass analyzing lens 22 is disposed downstream of the mass analyzing magnet 21, and is configured to adjust focusing/defocusing power for the ion beam. The mass analyzing lens 22 adjusts a focusing position of the ion beam passing through the mass analyzing slit 23 in a beam traveling direction (z-direction), and adjusts a mass resolution M/dM of the mass analyzing unit 20. The mass analyzing lens 22 is not an essential component, and the mass analyzing unit 20 need not have the mass analyzing lens 22.

The mass analyzing slit 23 is disposed downstream of the mass analyzing lens 22, and is disposed at a position away from the mass analyzing lens 22. The mass analyzing slit 23 is configured so that a beam deflection direction (x-direction) by the mass analyzing magnet 21 is a slit width direction, and has an opening 23a that is relatively short in the x-direction and relatively long in the y-direction.

The mass analyzing slit 23 may be configured so that the slit width is variable for adjusting the mass resolution. The mass analyzing slit 23 may be configured by two blockade bodies that are movable in the slit width direction, and may be configured so that the slit width is adjustable by changing an interval between the two blockade bodies. The mass analyzing slit 23 may be configured so that the slit width is variable by selecting any one of a plurality of slits having different slit widths.

The beam park device 24 is configured to cause the ion beam to temporarily retreat from the beamline A and to temporarily block the ion beam directed to the implantation processing chamber 16 (or the wafer W) located downstream. The beam park device 24 can be disposed at any desired position in an intermediate portion of the beamline A. For example, the beam park device 24 can be disposed between the mass analyzing lens 22 and the mass analyzing slit 23. A prescribed distance is required between the mass analyzing lens 22 and the mass analyzing slit 23. Accordingly, the beam park device 24 is disposed between both of them. In this manner, a length of the beamline A can be shortened, compared to a case where the beam park device 24 is disposed at another position. Therefore, the whole ion implanter 10 can be reduced in size.

The beam park device 24 includes a pair of park electrodes 25 (25a and 25b) and a beam dump 26. The pair of park electrodes 25a and 25b faces each other across the beamline A, and faces in a direction (y-direction) perpendicular to the beam deflection direction (x-direction) of the mass analyzing magnet 21. The beam dump 26 is disposed on the downstream side of the beamline A than the park electrodes 25a and 25b, and is disposed away from the beamline A in a facing direction of the park electrodes 25a and 25b.

The first park electrode 25a is disposed on an upper side of the beamline A in a direction of gravity, and the second park electrode 25b is disposed on a lower side of the beamline A in the direction of gravity. The beam dump 26 is disposed at a position away to the lower side of the beamline A in the direction of gravity, and is disposed on the lower side of the opening 23a of the mass analyzing slit 23 in the direction of gravity. For example, the beam dump 26 is configured to include a portion of the mass analyzing slit 23 where the opening 23a is not formed. The beam dump 26 may be configured to be separate from the mass analyzing slit 23.

The beam park device 24 deflects the ion beam by using an electric field applied between the pair of park electrodes 25a and 25b, and causes the ion beam to retreat from the beamline A. For example, a negative voltage is applied to the second park electrode 25b, based on a potential of the first park electrode 25a. In this manner, the ion beam is deflected downward from the beamline A in the direction of gravity, and is incident into the beam dump 26. In FIG. 2, a trajectory of the ion beam directed toward the beam dump 26 is indicated by a dashed line. The beam park device 24 causes the ion beam to pass toward the downstream side along the beamline A by setting the pair of park electrodes 25a and 25b to have the same potential. The beam park device 24 is configured to be operable by switching between a first mode in which the ion beam passes to the downstream side and a second mode in which the ion beam is incident into the beam dump 26.

An injector Faraday cup 28 is disposed downstream of the mass analyzing slit 23. The injector Faraday cup 28 is configured to be movable into and out of the beamline A by an operation of an injector driving unit 29. The injector driving unit 29 moves the injector Faraday cup 28 in a direction (for example, the y-direction) perpendicular to an extending direction of the beamline A. In a case where the injector Faraday cup 28 is disposed on the beamline A as illustrated by a dashed line in FIG. 2, the injector Faraday cup 28 blocks the ion beam directed toward the downstream side. On the other hand, as illustrated by a solid line in FIG. 2, in a case where the injector Faraday cup 28 retreats from the beamline A, the blocking of the ion beam directed toward the downstream side is released.

The injector Faraday cup 28 is configured to measure a beam current of the ion beam subjected to mass analyzing by the mass analyzing unit 20. The injector Faraday cup 28 can measure a mass analyzing spectrum of the ion beam by measuring the beam current while changing the strength of the magnetic field of the mass analyzing magnet 21. The mass resolution of the mass analyzing unit 20 can be calculated using the measured mass analyzing spectrum.

The beam shaping unit 30 includes a focusing/defocusing device such as a focusing/defocusing quadrupole lens (Q-lens), and is configured to shape the ion beam having passed through the mass analyzing unit 20 to have a desired cross-sectional shape. For example, the beam shaping unit 30 is configured to include an electric field type three-stage quadrupole lens (also referred to as a triplet Q-lens), which has three quadrupole lenses 30a, 30b, and 30c. The beam shaping unit 30 adopts the three lens devices 30a to 30c. Accordingly, the beam shaping unit 30 can adjust the ion beam to converge or diverge independently in the x-direction and the y-direction, respectively. The beam shaping unit 30 may include a magnetic field type lens device, or may include a lens device that shapes the beam by using both an electric field and a magnetic field.

The beam scanning unit 32 is a beam deflection device configured to provide reciprocating scanning using the beam and to perform scanning using the shaped ion beam in the x-direction. The beam scanning unit 32 has a scanning electrode pair facing in a beam scanning direction (x-direction). The scanning electrode pair is connected to a variable voltage power supply (not illustrated), and a voltage applied between the scanning electrode pair is periodically changed. In this manner, an electric field generated between the electrodes is changed so that the ion beam is deflected at various angles. As a result, a whole scanning range is scanned with the ion beam in the x-direction. In FIG. 1, the scanning direction and the scanning range of the ion beam are indicated by an arrow X, and a plurality of trajectories of the ion beam in the scanning range are indicated by a one dot chain line.

The beam parallelizing unit 34 is configured so that the traveling direction of the ion beam subject to the scanning becomes parallel to the trajectory of the designed beamline A. The beam parallelizing unit 34 has a plurality of arc-shaped parallelizing lens electrodes in which an ion beam passing slit is disposed in a central portion in the y-direction. The parallelizing lens electrode is connected to a high-voltage power supply (not illustrated), and applies an electric field generated by voltage application to the ion beam so that the traveling directions of the ion beam are parallelized. The beam parallelizing unit 34 may be replaced with another beam parallelizing device, and the beam parallelizing device may be configured to serve as a magnet device using a magnetic field.

An acceleration/deceleration (A/D) column (not illustrated) for accelerating or decelerating the ion beam may be disposed downstream of the beam parallelizing unit 34.

The angular energy filter (AEF) 36 is configured to analyze energy of the ion beam, to deflect ions having necessary energy downward, and to guide the ions to the implantation processing chamber 16. The angular energy filter 36 has an AEF electrode pair for electric field deflection. The AEF electrode pair is connected to a high-voltage power supply (not illustrated). In FIG. 2, the ion beam is deflected downward by applying a positive voltage to the upper AEF electrode and applying a negative voltage to the lower AEF electrode. The angular energy filter 36 may be configured to include a magnet device for magnetic field deflection, or may be configured to include a combination between the AEF electrode pair for electric field deflection and the magnet device for magnetic field deflection.

In this way, the beamline device 14 supplies the ion beam to be used for irradiating the wafer W to the implantation processing chamber 16.

The implantation processing chamber 16 includes an energy defining slit 38, a plasma shower device 40, side cups 42, a center cup 44, and a beam stopper 46, in order from the upstream side of the beamline A. As illustrated in FIG. 2, the implantation processing chamber 16 includes a platen driving device 50 that holds one or more wafers W.

The energy defining slit 38 is disposed on the downstream side of the angular energy filter 36, and analyzes the energy of the ion beam incident into the wafer W together with the angular energy filter 36. The energy defining slit 38 is an energy defining slit (EDS) configured to include a slit that is horizontally long in the beam scanning direction (x-direction). The energy defining slit 38 causes the ion beam having a desired energy value or a desired energy range to pass toward the wafer W, and blocks the other ion beams.

The plasma shower device 40 is located on the downstream side of the energy defining slit 38. The plasma shower device 40 supplies low-energy electrons to the ion beam and a surface of the wafer W (wafer processing surface) in accordance with a beam current amount of the ion beam, and suppresses an accumulation of positive charges on the wafer processing surface which are induced by the ion implantation. For example, the plasma shower device 40 includes a shower tube through which the ion beam passes, and a plasma generating device that supplies electrons into the shower tube.

The side cups 42 (42L and 42R) are configured to measure the beam current of the ion beam during a process of implanting the ions into the wafer W. As illustrated in FIG. 2, the side cups 42L and 42R are disposed to be shifted to the left and right (x-direction) with respect to the wafer W disposed on the beamline A, and are disposed at a position where the side cups 42L and 42R do not block the ion beam directed toward the wafer W during the ion implantation. The ion beam is subject to scanning in the x-direction beyond a range where the wafer W is located. Accordingly, a portion of the beam for the scanning is incident into the side cups 42L and 42R even during the ion implantation. In this manner, the beam current amount during the ion implantation process is measured by the side cups 42L and 42R.

The center cup 44 is configured to measure the beam current on the wafer processing surface. The center cup 44 is configured to be movable by an operation of a driving unit 45, is retreated from an implantation position where the wafer W is located during the ion implantation, and is inserted into the implantation position when the wafer W is not located at the implantation position. The center cup 44 measures the beam current while moving in the x-direction. In this manner, the center cup 44 can measure the beam current over the whole beam scanning range in the x-direction. In the center cup 44, a plurality of Faraday cups may be aligned in the x-direction to be formed in an array shape so that the beam currents can be simultaneously measured at a plurality of positions in the beam scanning direction (x-direction).

At least one of the side cups 42 and the center cup 44 may include a single Faraday cup for measuring the beam current amount, or may include an angle measurement device for measuring angle information of the beam. For example, the angle measurement device includes a slit and a plurality of current detectors disposed away from the slit in the beam traveling direction (z-direction). For example, the angle measurement device can measure an angle component of the beam in the slit width direction by causing the plurality of current detectors aligned in the slit width direction to measure the beam having passed through the slit. At least one of the side cups 42 and the center cup 44 may include a first angle measurement device capable of measuring angle information in the x-direction and a second angle measurement device capable of measuring angle information in the y-direction.

The platen driving device 50 includes a wafer holding device 52, a reciprocating mechanism 54, a twist angle adjusting mechanism 56, and a tilt angle adjusting mechanism. 58. The wafer holding device 52 includes an electrostatic chuck for holding the wafer W. The reciprocating mechanism 54 causes the wafer holding device 52 to reciprocate in a reciprocating direction (y-direction) perpendicular to the beam scanning direction (x-direction). In this manner, the wafer held by the wafer holding device 52 is caused to reciprocate in the reciprocating direction (y-direction). In FIG. 2, a reciprocating motion of the wafer W is indicated by an arrow Y.

The twist angle adjusting mechanism 56 adjusts a rotation angle of the wafer W. The twist angle adjusting mechanism 56 rotates the wafer W around a normal line of the wafer processing surface as a rotation center axis. In this manner, the twist angle adjusting mechanism 56 adjusts a twist angle between an alignment mark disposed on an outer peripheral portion of the wafer and a reference position. Here, the alignment mark of the wafer means a notch or an orientation flat disposed on the outer peripheral portion of the wafer, and means a mark that serves as a reference for a crystal axis direction of the wafer or an angular position in a circumferential direction of the wafer. The twist angle adjusting mechanism 56 is disposed between the wafer holding device 52 and the reciprocating mechanism 54, and is caused to reciprocate together with the wafer holding device 52.

The tilt angle adjusting mechanism 58 adjusts tilting of the wafer W, and adjusts a tilt angle between the traveling direction of the ion beam directed toward the wafer processing surface and the normal line of the wafer processing surface. In the present embodiment, out of the tilt angles of the wafer W, an angle with respect to which the axis in the x-direction is a rotation center axis is adjusted as the tilt angle. The tilt angle adjusting mechanism 58 is disposed between the reciprocating mechanism 54 and an inner wall of the implantation processing chamber 16, and rotates the whole platen driving device 50 including the reciprocating mechanism 54 in an R-direction. In this manner, the tilt angle adjusting mechanism 58 is configured to adjust the tilt angle of the wafer W.

The platen driving device 50 holds the wafer W so that the wafer W is movable between an implantation position where the wafer W is irradiated with the ion beam and a transfer position where the wafer W is loaded or unloaded between the platen driving device 50 and the wafer transfer device 18. FIG. 2 illustrates a state where the wafer W is located at the implantation position, and the platen driving device 50 holds the wafer W so that the beamline A and the wafer W intersect each other. The transfer position of the wafer W corresponds to a position of the wafer holding device 52 when the wafer W is loaded or unloaded through a transfer port 48 by a transfer mechanism or a transfer robot disposed in the wafer transfer device 18.

The beam stopper 46 is disposed on the most downstream side of the beamline A, and is mounted on the inner wall of the implantation processing chamber 16, for example. In a case where the wafer W does not exist on the beamline A, the ion beam is incident into the beam stopper 46. The beam stopper 46 is located close to the transfer port 48 that connects the implantation processing chamber 16 and the wafer transfer device 18 to each other, and is disposed at a position vertically below the transfer port 48.

The ion implanter 10 further includes a control device 60. The control device 60 controls an overall operation of the ion implanter 10. The control device 60 is realized in hardware by elements such as a CPU and a memory of a computer or a mechanical device, and in software by a computer program or the like. Various functions provided by the control device 60 can be realized by cooperation between the hardware and the software.

Figure 3:
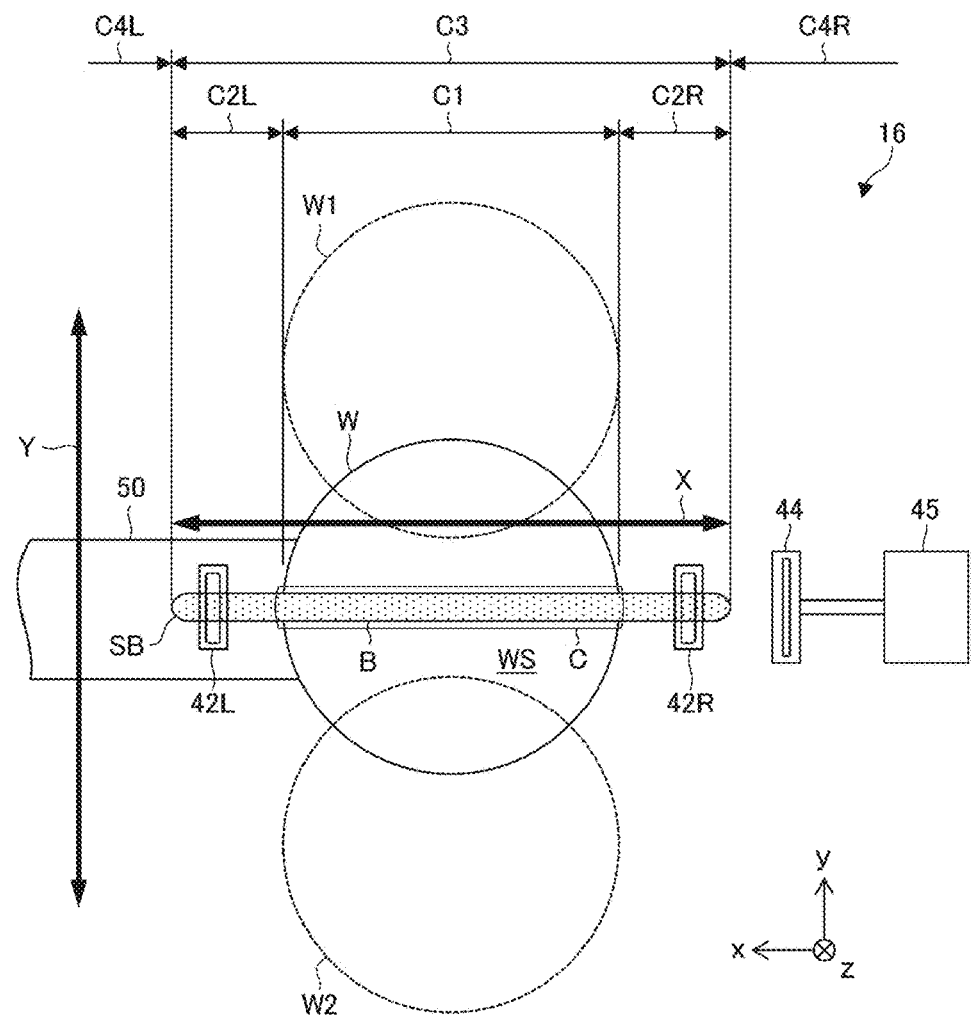
FIG. 3 is a front view illustrating a schematic configuration inside an implantation processing chamber in FIG. 1.

FIG. 3 is a front view illustrating a schematic configuration inside the implantation processing chamber 16 in FIG. 1, and illustrates a processing surface WS of the wafer W to be irradiated with an ion beam B when viewed from the front. The ion beam B is subject to reciprocating scanning in the first direction (x-direction) as indicated by an arrow X, and is incident into the wafer W, as a scan beam SB subject to reciprocating scanning in the x-direction. The wafer W is held by the platen driving device 50, and is subject to reciprocating motion in the second direction (y-direction) as indicated by an arrow Y. In FIG. 3, with regard to the wafer W subjected to reciprocating scan in the y-direction by the operation of the platen driving device 50, the wafer W1 located at an uppermost position and the wafer W2 located at a lowermost position are illustrated by a dashed lines. An implantation position 70 at which the ions are implanted when the scan beam SB is incident into the wafer processing surface WS during the implantation process is illustrated by a thin solid line.

The ion beam B is subject to reciprocating scanning over an irradiation range C3 including an implantation range C1 where the wafer W is located and monitor ranges C2L and C2R outside the implantation range C1. The left and right side cups 42L and 42R are respectively disposed in the left and right monitor ranges C2L and C2R. The left and right side cups 42L and 42R can measure the ion beam B subject to over-scanning the monitor ranges C2L and C2R during the implantation process. The implantation position C in the x-direction coincides with the implantation range C1. The implantation position C in the y-direction coincides with a position of the ion beam B or the scan beam SB in the y-direction. The implantation position C in the z-direction coincides with a position on the wafer processing surface WS in the z-direction.

The center cup 44 is retreated to a non-irradiation range C4R outside the irradiation range C3 during the implantation process. In the illustrated configuration, the driving unit 45 is disposed on the right side, and the center cup 44 is retreated to the non-irradiation range C4R on the right side during the implantation process. In a configuration in which the driving unit 45 is disposed on the left side, the center cup 44 may be retreated to a non-irradiation range C4L on the left side during the implantation process.

The center cup 44 is disposed in the implantation range C1 during a preparation process performed prior to the implantation process, and measures the beam current of the ion beam B in the implantation range C1. The center cup 44 measures the beam current while moving in the x-direction in the implantation range C1, and measures a beam current density distribution of the scan beam SB in the x-direction.

Figure 4:
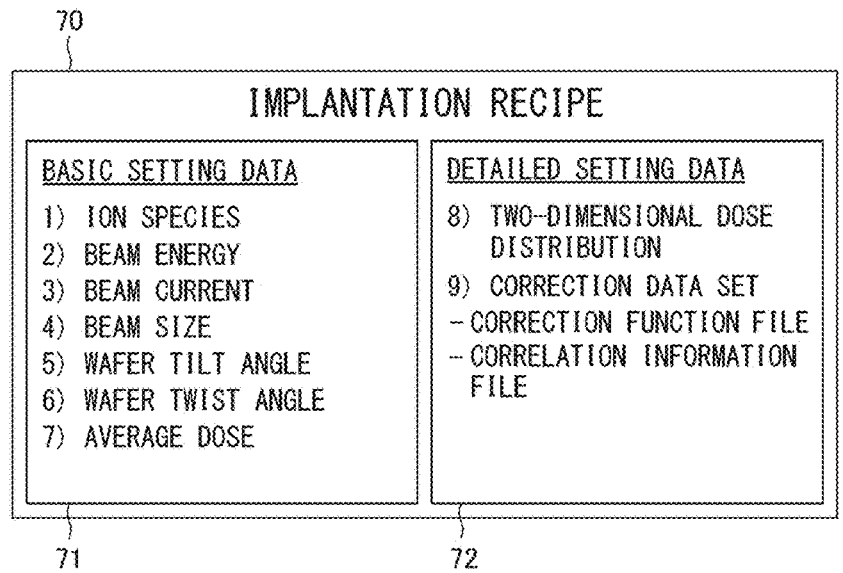
FIG. 4 is a diagram schematically illustrating a data structure of an implantation recipe.

FIG. 4 is a diagram schematically illustrating a data structure of an implantation recipe 70. The control device 60 controls the ion implantation process in accordance with the implantation recipe. The implantation recipe 70 includes basic setting data 71 and detailed setting data 72. The basic setting data 71 determines an implantation condition indicating essential settings. For example, the basic setting 71 includes setting data of 1) an ion species, 2) beam energy, 3) a beam current, 4) a beam size, 5) a wafer tilt angle, 6) a wafer twist angle, and 7) an average dose. The average dose indicates an in-plane average value of a dose distribution to be implanted into the wafer processing surface.

The detailed setting data 72 is set in a case where the "non-uniform implantation" is performed to intentionally provide non-uniformity for the dose distribution of the ions to be implanted into the wafer processing surface. The detailed setting data 72 may not be set in a case where "uniform implantation" is performed to provide a uniform pattern for the two-dimensional dose distribution on the wafer processing surface. The detailed setting data 72 includes 8) the two-dimensional dose distribution and 9) a correction data set. For example, the two-dimensional dose distribution is an actual pattern of the two-dimensional non-uniform dose distribution realized on the wafer processing surface WS in a case where the non-uniform implantation is performed. The correction data set is used for performing variable control on the beam scan speed in the first direction (x-direction) by the beam scanning unit 32 and the wafer motion speed in the second direction (y-direction) by the platen driving device 50. The correction data set includes a correction function file and a correlation information file for realizing the two-dimensional non-uniform dose distribution.

Figure 5A:
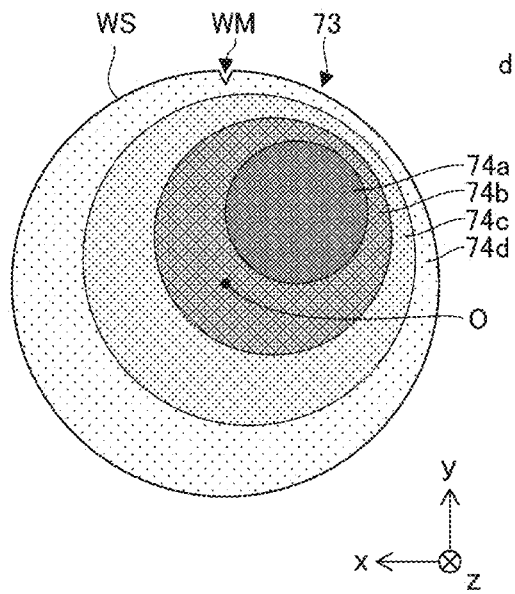
FIGS. 5A and 5B are diagrams schematically illustrating a two-dimensional dose distribution.
Figure 5B:
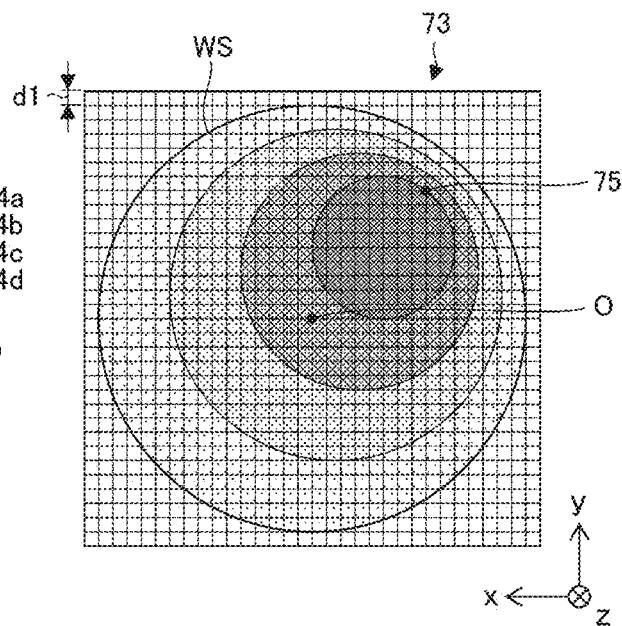

FIGS. 5A and 5B are diagrams schematically illustrating a two-dimensional non-uniform dose distribution 73. FIG. 5A illustrates the two-dimensional dose distribution that is set to be non-uniform on the circular wafer processing surface WS, and illustrates a magnitude of the dose by using the contrasting density of regions 74a, 74b, 74c, and 74d on the wafer processing surface WS. In the illustrated example, the dose in the first region 74a is the largest, and the dose in the fourth region 74d is the smallest. The two-dimensional non-uniform dose distribution 73 is determined, based on an orientation of the wafer W held by the platen driving device 50. Specifically, the two-dimensional non-uniform dose distribution 73 is determined, based on a beam scan direction (first direction or x-direction) and a wafer motion direction (second direction or y-direction) when the wafer W is disposed on the platen driving device 50 so as to indicate a wafer twist angle determined in the basic setting data 71. In the illustrated example, a direction from a center O of the wafer W toward an alignment mark WM is set as the +y-direction. However, a position of the alignment mark WM may vary depending on the wafer twist angle.

FIG. 5B schematically illustrates a plurality of lattice points 75 for defining the two-dimensional non-uniform dose distribution 73. For example, the plurality of lattice points 75 are set with equal intervals on the wafer processing surface WS. For example, the two-dimensional non-uniform dose distribution 73 is defined by data that associates each position coordinate at the plurality of lattice points 75 with each of dose amounts at the plurality of lattice points 75. For example, in a case of a wafer having a diameter of 300 mm, the lattice points 75 of 31×31 in which the center O of the wafer processing surface WS is an origin is set, and an interval d1 between two of the lattice points 75 adjacent to each other is 10 mm. The interval d1 between the two of the plurality of lattice points 75 adjacent to each other is set so as to be smaller than a beam size of the ion beam B. An example of the beam size of the ion beam B is approximately 20 mm to 30 mm.

Figure 6:
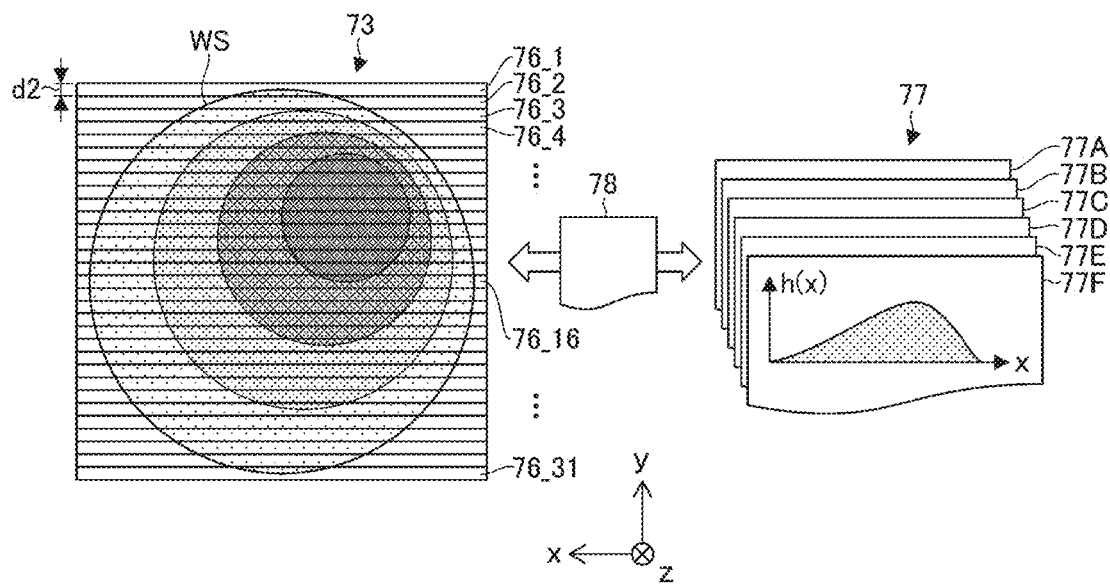
FIG. 6 is a diagram illustrating an example of a correction function file and a correlation information file.

FIG. 6 is a diagram illustrating an example of correction function files 77 and a correlation information file 78. Each of the correction function files 77 defines a correction function h(x) determined based on a one-dimensional non-uniform dose distribution in the first direction (x-direction). A plurality of the correction function files 77 are defined for one of the two-dimensional non-uniform dose distributions 73, and six correction function files 77A, 77B, 77C, 77D, 77E, and 77F are defined in the illustrated example. In the plurality of correction function files 77A to 77F, the correction functions h(x) have mutually different shapes, respectively. For example, the number of the plurality of correction function files 77A to 77F which are defined for one of the two-dimensional non-uniform dose distributions 73 is as much as approximately 5 to 10.

The correlation information file 78 defines correlation information that associates the two-dimensional non-uniform dose distribution 73 with the plurality of correction function files 77. The wafer processing surface WS is divided into a plurality of division regions 76_1 to 76_31 (generically referred to as division regions 76) in the second direction (y-direction). Any one of the plurality of correction function files 77A to 77F is associated with any one of the plurality of division regions 76. Each division width d2 in the y-direction of the plurality of division regions 76 is the same as the interval d1 of the lattice points 75, and is 10 mm, for example. Each center position of the plurality of division regions 76 in the y-direction can correspond to each position of the lattice points 75. The division width d2 in the y-direction of the plurality of division regions 76 is set to be smaller than a beam size (for example, 20 mm to 30 mm) of the ion beam.

The number of the plurality of correction function files 77 is smaller than the number of the plurality of division regions 76. Therefore, at least one of the correction function files 77 is associated with two or more of the plurality of division regions 76. In other words, the correction function h(x) determined in one of correction function files 77 is commonly used for two or more of the plurality of division regions 76. The correction function h(x) is normalized so as to be able to be used in two or more of the plurality of division regions 76. For example, the correction function h(x) is normalized such that a maximum value, an average value, or an integral value in the first direction of the correction function h(x) becomes a predetermined value. As correction coefficients k, the correlation information file 78 stores ratios between respective one-dimensional non-uniform dose distributions D(x) in the plurality of division regions 76 and the respective correction functions h(x) corresponding to D(x). Each of one-dimensional non-uniform dose distributions D(x) in the plurality of division regions 76 corresponds to k·h(x) obtained by multiplying the correction function h(x) by the correction coefficient k. A value of the correction coefficient k tends to become large in one of the division regions 76 having a relatively high dose, and tends to become small in another of the division regions 76 having a relatively low dose. The correction coefficients k are used to control the wafer motion speed in the second direction (y-direction).

Figures 7, 8:
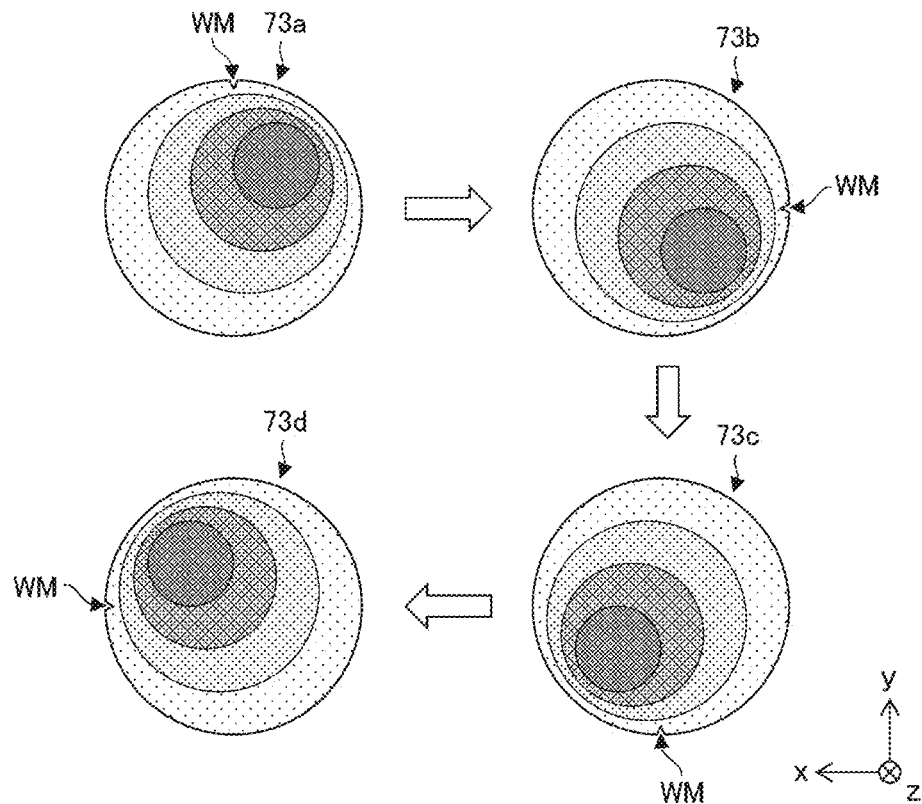
FIG. 7 is a table illustrating an example of the correlation information file.
FIG. 8 is a diagram schematically illustrating multiple step implantation.

FIG. 7 is a table illustrating an example of the correlation information file 78. The correlation information file 78 determines ranges in the x-direction and the y-direction where the wafer processing surface WS exists, symbols A to F that identify the correction function files 77, and values of the correction coefficients k, for each of region numbers "1" to "31" that identifies each of the plurality of division regions 76. The wafer processing surface WS has a disc shape. Accordingly, as the implant position becomes away from the center O of the wafer processing surface WS in the y-direction, the range in the x-direction where the wafer processing surface WS exists decreases. For example, in the region number "1", the wafer processing surface WS exists only in a range of ±20 mm in the x-direction with respect to the center O of the wafer processing surface WS, and the wafer processing surface WS does not exist outside the range. On the other hand, in the region number "16" corresponding to the center O of the wafer processing surface WS in the y-direction, the wafer processing surface WS exists in an entire range of ±150 mm in the x-direction which corresponds to the diameter of the wafer processing surface WS. In the illustrated example, each width of the plurality of division regions 76 in the y-direction is a fixed value (that is 10 mm). However, the respective widths of the plurality of division regions 76 in the y-direction may be different from each other.

FIG. 8 is a diagram schematically illustrating a multiple step implantation. In a case where the non-uniform implantation is realized, the multiple step implantation may be performed to practice the ion implantations multiple times with changing the wafer twist angle while fixing the two-dimensional non-uniform dose distribution based on the alignment mark WM of the wafer W as a reference. When the wafer twist angle is changed, the two-dimensional non-uniform dose distribution based on a coordinate system of the ion implanter 10 is rotated together. FIG. 8 illustrates a case where the ion implantations are performed four times with rotating the wafer twist angle as much as 90 degrees between the respective ion implantations. A first two-dimensional non-uniform dose distribution 73a is the same as the two-dimensional non-uniform dose distribution 73 illustrated in FIG. 5A. A second two-dimensional non-uniform dose distribution 73b is obtained by rotating the first two-dimensional non-uniform dose distribution 73a clockwise as much as 90 degrees. Similarly, a third two-dimensional non-uniform dose distribution 73c is obtained by rotating the second two-dimensional non-uniform dose distribution 73b clockwise as much as 90 degrees, and a fourth two-dimensional non-uniform dose distribution 73d is obtained by rotating the third two-dimensional non-uniform dose distribution 73c clockwise as much as 90 degrees. Each of the plurality of two-dimensional non-uniform dose distributions 73a to 73d in the multiple step implantation has a different shape when viewed from the coordinate system of the ion implanter 10 in the x-direction and the y-direction. Therefore, in the multiple step implantation, an individual correction data set is determined for each of the plurality of two-dimensional non-uniform dose distributions 73a to 73d. In a case where the quadruple step implantation is performed, the implantation recipe 70 includes four detailed setting data 72 corresponding to the four implantation processes.

Figure 9:
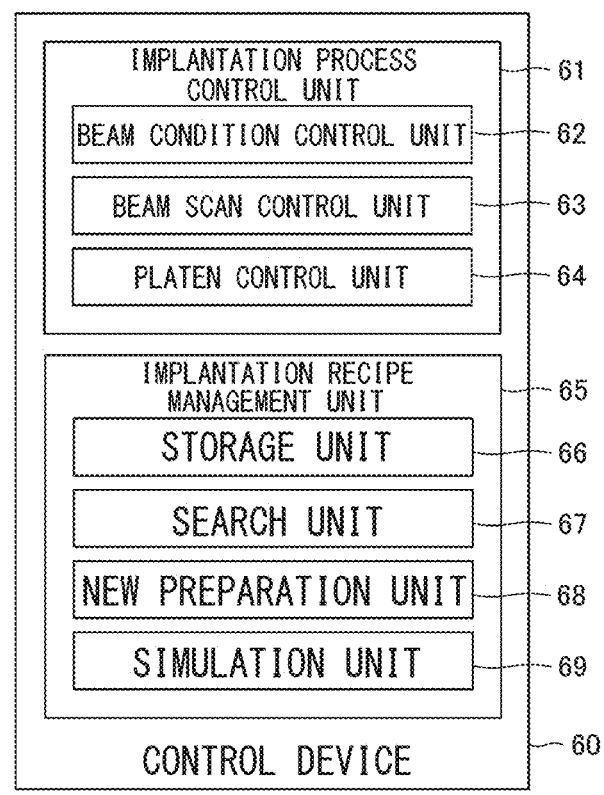
FIG. 9 is a block diagram schematically illustrating a functional configuration of a control device.

FIG. 9 is a block diagram schematically illustrating a functional configuration of the control device 60. The control device 60 includes an implantation process control unit 61 and an implantation recipe management unit 65. The implantation process control unit 61 controls an operation of the ion implanter 10, based on the implantation recipe 70, and performs an implantation process in accordance with the implantation recipe 70. The implantation recipe management unit 65 manages the implantation recipe 70 used in the implantation process.

The implantation process control unit 61 includes a beam condition control unit 62, a beam scan control unit 63, and a platen control unit 64. The beam condition control unit 62 controls 1) the ion species, 2) the beam energy, 3) the beam current, and 4) the beam size which are set in the implantation recipe. The beam scan control unit 63 controls the beam scan speed in accordance with the correction function files. The platen control unit 64 controls 5) the wafer tilt angle and 6) the wafer twist angle which are set in the implantation recipe, and controls the wafer motion speed in accordance with the correlation information file. The beam scan speed and the wafer motion speed are properly controlled in accordance with a beam irradiation position in the first direction and the second direction where the wafer processing surface WS is irradiated with the ion beam. In this manner, 8) the two-dimensional non-uniform dose distribution is realized. By the implantation process control unit 61, an implantation time during which the wafer processing surface WS is irradiated with the ion beam is adjusted. In this manner, the implantation process control unit 61 controls the 7) the average dose.

The beam condition control unit 62 controls the ion species of the ion beam by selecting a gas type used in the ion generator 12, adjusting an extraction voltage applied to the ion generator 12, and adjusting the strength of the magnetic field applied in the mass analyzing unit 20. The beam condition control unit 62 controls the beam energy of the ion beam by adjusting the extraction voltage applied to the ion generator 12, a voltage applied to the beam parallelizing unit 34, a voltage applied to an AD column, and a voltage applied to the angular energy filter 36. The beam condition control unit 62 controls the beam current of the ion beam by adjusting various parameters such as a gas amount, an arc current, an arc voltage, and a source magnet current of the ion generator 12, and an opening width of the mass analyzing slit 23. The beam condition control unit 62 controls the beam size of the ion beam incident into the wafer processing surface WS by adjusting an operation parameter of the focusing/defocusing device included in the beam shaping unit 30.

The beam scan control unit 63 generates a scan voltage parameter for designating a control voltage V to be applied to a scanning electrode pair of the beam scanning unit 32, based on the correction function files 77. A beam scan speed $v_B$ realized by the beam scanning unit 32 is substantially proportional to dV/dt which is a change rate of the control voltage V applied to the scanning electrode pair with respect to a time t. In a case where the one-dimensional dose distribution in the beam scanning direction (first direction or x-direction) is made uniform, the scanning voltage parameter is determined so that the time change rate dV/dt of the control voltage is constant. In a case where the one-dimensional dose distribution in the beam scanning direction (first direction or x-direction) is made non-uniform, the scanning voltage parameter is determined so that the time change rate dV/dt of the control voltage is changed in accordance with a position in the beam scanning direction. Specifically, for a position requiring a relatively high dose, the time change rate dV/dt of the control voltage is decreased so that the beam scan speed $v_B$ is slow. Conversely, for a position requiring a relatively low dose, the time change rate dV/dt of the control voltage is increased so that the beam scan speed $v_B$ is fast. For example, a beam scan speed $v_B(x)$ corresponding to the position in the x-direction is set so as to be proportional to a reciprocal $1/h(x)$ of the correction function $h(x)$ indicating the one-dimensional non-uniform dose distribution. That is, the beam scan speed $v_B(x)$ is inversely proportional to the correction function $h(x)$ indicating the one-dimensional non-uniform dose distribution.

The platen control unit 64 generates a speed parameter for designating a reciprocating speed of the reciprocating mechanism 54, that is, a wafer motion speed $v_W$, based on the correlation information file 78. In a case where a dose distribution in a wafer motion direction (second direction or y-direction) is made uniform, the speed parameter is determined so that the wafer motion speed $v_W$ is constant. On the other hand, in a case where the dose distribution in the wafer motion direction (second direction or y-direction) is made non-uniform, the speed parameter is determined so that a wafer motion speed $v_W(y)$ is changed in accordance with a position in the wafer motion direction. Specifically, the speed parameter is determined so that the wafer motion speed $v_W(y)$ is slower for the position requiring the relatively high dose, and the wafer motion speed $v_W(y)$ is faster for the position requiring the relatively low dose. For example, the wafer motion speed $v_W(y)$ corresponding to the position in the y-direction is set so as to be proportional to the reciprocal 1/k of the correction coefficient k in each of the plurality of division regions 76 determined in the correlation information file 78. That is, the wafer motion speed $v_W(y)$ corresponding to the position in the y-direction is inversely proportional to the correction coefficient k corresponding to the position in the y-direction.

The implantation recipe management unit 65 includes a storage unit 66, a search unit 67, a new preparation unit 68, and a simulation unit 69. The storage unit 66 stores the implantation recipe used in the past implantation process. For example, the storage unit 66 is an internal storage device such as a memory or a hard disk incorporated in the control device 60. The storage unit 66 may be configured to read the implantation recipe stored in an external storage device such as a server disposed outside the control device 60, and to temporarily store the implantation recipe.

The search unit 67 searches for the implantation recipe similar to the implantation recipe designated by a user, from the implantation recipes stored in the storage unit 66. The search unit 67 identifies the implantation recipe that can be diverted from the past implantation recipes by searching for the implantation recipe similar to the implantation recipe which designates various conditions of the implantation process to be performed. The past implantation recipe is diverted. Accordingly, work for preparing a new implantation recipe can be omitted.

In a case where the similar implantation recipe is not found by the search of the search unit 67, the new preparation unit 68 prepares the new implantation recipe for realizing the implantation condition designated by the user. The simulation unit 69 simulates the implantation process according to the new implantation recipe prepared by the new preparation unit 68, thereby verifying whether or not the implantation condition designated by the user can be realized. The new preparation unit 68 prepares the implantation recipe that can realize a desired implantation condition with high accuracy by correcting the implantation recipe, based on a simulation result of the simulation unit 69.

As the implantation recipe for performing the non-uniform implantation, the storage unit 66 may store the implantation recipe including both a target pattern and an actual pattern of the two-dimensional non-uniform dose distribution. The target pattern of the two-dimensional non-uniform dose distribution is the two-dimensional non-uniform dose distribution designated by the user, and is the two-dimensional non-uniform dose distribution that is a source for preparing a correction data set. The actual pattern of the two-dimensional non-uniform dose distribution is the two-dimensional non-uniform dose distribution actually realized on the wafer processing surface WS when the ions are implanted into the wafer processing surface WS in accordance with the correction data set included in the implantation recipe. For example, the actual pattern of the two-dimensional non-uniform dose distribution is an actually measured pattern obtained by measuring an in-plane distribution of the dose on the wafer processing surface WS after the ion implantation.

As the actual pattern of the two-dimensional non-uniform dose distribution, the storage unit 66 may store an estimated pattern of the dose on the wafer processing surface WS when the non-uniform implantation is simulated in accordance with the correction data set. For example, the non-uniform implantation is simulated by the simulation unit 69. The simulation unit 69 simulates the non-uniform implantation when the beam scanning unit 32 and the platen driving device 50 are operated in accordance with the correction data set, and estimates the two-dimensional dose distribution of the ions to be implanted into the wafer processing surface WS.

The storage unit 66 may store only one or more of the implantation recipes that have been used in the ion implanter 10. The storage unit 66 may store one or more of the implantation recipes that have not been used in the ion implanter 10. The storage unit 66 may store one or more of the implantation recipes that are newly prepared by the new preparation unit 68, simulated by the simulation unit 69 and however not yet actually used for the ion implantation process. The storage unit 66 may store one or more of the implantation recipes that have been used in another ion implanter, or may store one or more of the implantation recipes that are newly prepared and simulated in another ion implanter.

When the target pattern of the two-dimensional non-uniform dose distribution for performing the non-uniform implantation is newly acquired, the search unit 67 identifies the implantation recipe including the two-dimensional non-uniform dose distribution similar to the acquired target pattern, from the past implantation recipes. For example, the search unit 67 searches for the actual patterns of the two-dimensional non-uniform dose distributions included in the implantation recipes stored in the storage unit 66, and identifies the actual pattern similar to the new target pattern. As a searching target, the search unit 67 may select the estimated pattern obtained by simulating the two-dimensional non-uniform dose distribution included in the implantation recipe. Alternatively, as the searching target, the search unit 67 may select the target pattern of the two-dimensional non-uniform dose distribution included in the implantation recipe.

The search unit 67 evaluates similarity between two of the two-dimensional non-uniform dose distributions by comparing the respective doses at the plurality of lattice points 75 as illustrated in FIG. 5B with each other. For example, the search unit 67 determines that the two of the two-dimensional non-uniform dose distributions which are compared are similar to each other in a case where a standard deviation of differences between the respective doses at the plurality of lattice points 75 is equal to or smaller than a predetermined reference value. The search unit 67 may evaluate the similarity between the two of the two-dimensional non-uniform dose distributions, based on another method. A correlation coefficient such as a cosine similarity or a Pearson correlation, or a distance metric such as a Euclidean distance, a Mahalanobis distance, or a Chebyshev distance may be used.

As a preparation process before searching for the similar two-dimensional non-uniform dose distribution, the search unit 67 may convert the target pattern of the newly acquired two-dimensional non-uniform dose distribution into a comparable data format. In a case where the target pattern of the newly acquired two-dimensional non-uniform dose distribution does not have a data format for determining the dose at the plurality of lattice points 75 as illustrated in FIG. 5B, the search unit 67 may convert the target pattern so as to have the data format for determining the dose at the plurality of lattice points 75.

As a searching condition, the search unit 67 may use an implantation condition other than the two-dimensional non-uniform dose distribution included in the implantation recipe. For example, the search unit 67 may identify the implantation recipes in which at least one of beam conditions such as 1) the ion species, 2) the beam energy, 3) the beam current, and 4) the beam size coincides with or similar to each other. In this case, the search unit 67 may acquire at least one of the beam conditions together with the new target pattern of the two-dimensional non-uniform dose distribution, and may identify the implantation recipe including the two-dimensional non-uniform dose distribution similar to the target pattern, from the implantation recipes corresponding to the acquired at least one beam condition.

The search unit 67 may determine at least one of the beam conditions, based on the newly acquired target pattern of the two-dimensional non-uniform dose distribution. For example, the search unit 67 may determine a constraining condition such as the beam current or the beam size needed to realize the target pattern of the two-dimensional non-uniform dose distribution. The search unit 67 may identify the implantation recipe including the two-dimensional non-uniform dose distribution similar to the target pattern, from the implantation recipes which include at least one of the beam conditions which coincides with or is similar to the determined at least one of the beam conditions.

The search unit 67 may display a search result on a display device. The search unit 67 may display a first map indicating the newly acquired target pattern of the two-dimensional non-uniform dose and a second map indicating the two-dimensional non-uniform dose distribution similar to the target pattern on the display device. In this manner, the user may be able to verify the search result by comparing the first map and the second map with each other. The search unit 67 may generate a difference map indicating a difference between the first map and the second map, and may display the difference map on the display device. The search unit 67 may display an index for evaluating similarity between the first map and the second map on the display device, or may display a value indicating the similarity index such as the standard deviation, the correlation coefficient, and the distance metric on the display device.

The search unit 67 may identify a plurality of the implantation recipes including the two-dimensional non-uniform dose distribution similar to the newly acquired target pattern. The search unit 67 may display the plurality of identified implantation recipes on the display device so that the user can select anyone of the displayed implantation recipes. The search unit 67 may sort and display the plurality of identified implantation recipes, in order from one having closest similarity to one having farthest similarity.

The new preparation unit 68 automatically prepares the correction data set for realizing the two-dimensional non-uniform dose distribution similar to the newly acquired target pattern. The new preparation unit 68 divides the two-dimensional non-uniform dose distribution serving as the target pattern, in the y-direction, and converts the two-dimensional non-uniform dose distribution into the one-dimensional non-uniform dose distributions D(x) which correspond to the plurality of division regions, respectively. The new preparation unit 68 generates a plurality of initial functions f(x) by normalizing the one-dimensional non-uniform dose distributions D(x) in the respective of the plurality of division regions. The new preparation unit 68 initially aggregates mutually similar functions out of the plurality of initial functions f(x), and generates a plurality of aggregate functions g(x) whose number is smaller than the number of the plurality of initial functions f(x). The simulation unit 69 simulates the ion implantation based on the plurality of generated aggregate functions g(x), and calculates an estimated pattern of the two-dimensional non-uniform dose distribution on the wafer processing surface WS. The new preparation unit 68 generates a plurality of correction functions h(x) by correcting the plurality of aggregate functions g(x) so that the calculated estimated pattern becomes similar to the target pattern.

Figure 10:
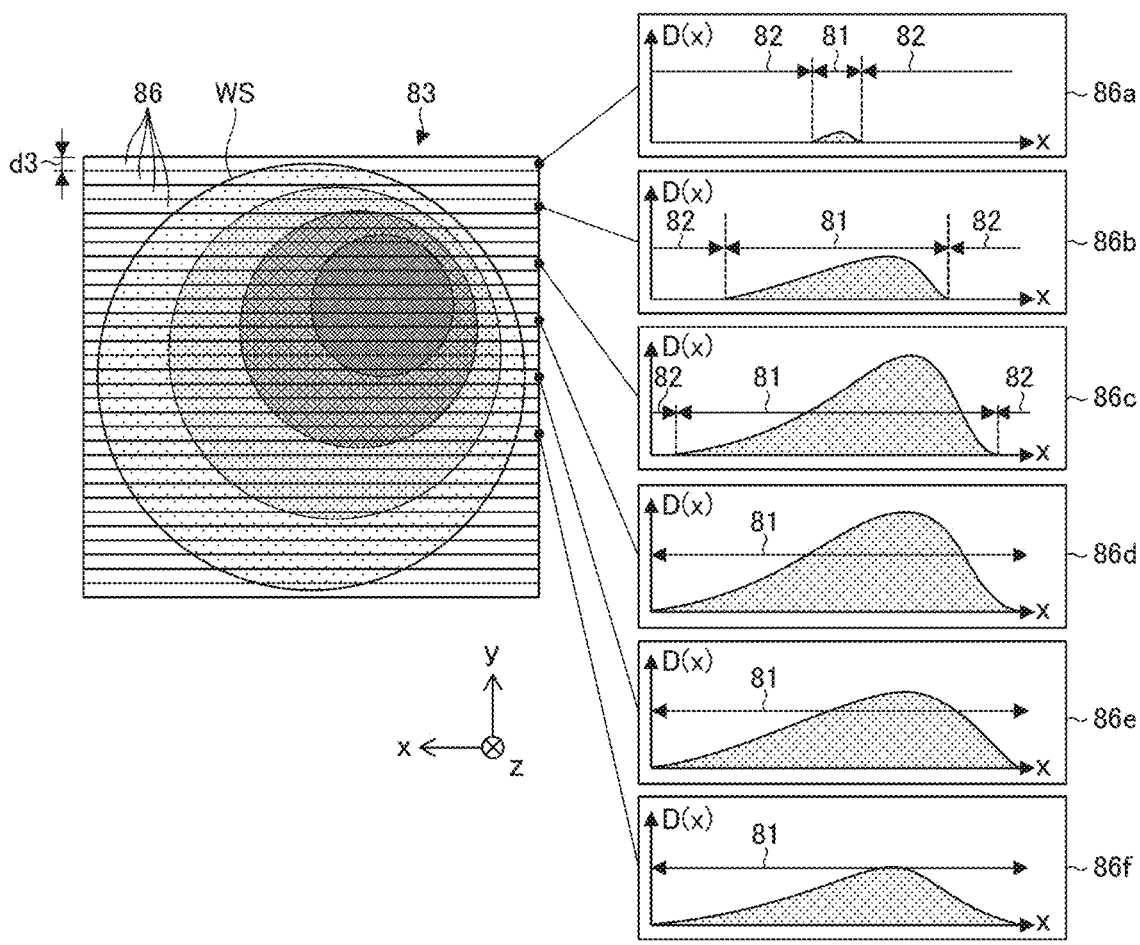
FIG. 10 is a diagram schematically illustrating a plurality of one-dimensional non-uniform dose distributions.

FIG. 10 is a diagram illustrating an example of the plurality of the one-dimensional non-uniform dose distributions D(x). As in FIG. 6, the wafer processing surface WS is divided in the y-direction, and a plurality of division regions 86 are set. The two-dimensional non-uniform dose distribution 83 serving as the target pattern on the wafer processing surface WS is converted into the one-dimensional non-uniform dose distributions D(x) in the respective of the plurality of division regions 86. The one-dimensional non-uniform dose distribution D(x) set for each of the plurality of division regions 86 represents a one-dimensional dose distribution in the first direction (x-direction) at each of the plurality of different positions in the second direction (y-direction) on the wafer processing surface WS.

FIG. 10 illustrates the one-dimensional non-uniform dose distributions D(x). The wafer processing surface WS is divided into 31 division regions 86. The one-dimensional non-uniform dose distributions D(x) in a first division region 86a, a fourth division region 86b, an eighth division region 86c, a twelfth division region 86d, a sixteenth division region 86e, and a twentieth division region 86f are respectively illustrated. In the illustrated example, 31 one-dimensional non-uniform dose distributions D(x) are generated corresponding to the 31 division regions 86. A division width d3 of the plurality of division regions 86 is set so as to be smaller than the beam size of the ion beam B, and is set to 10 mm, for example.

An implantation range 81 in which the wafer processing surface WS is located is set in each of the plurality of division regions 86. The implantation range 81 is equivalent to an X-range set in the correlation information file in FIG. 7. A non-implantation range 82 in which the wafer processing surface WS is not located can be set in each of the plurality of division regions 86. The non-implantation range 82 is a range outside the implantation range 81, and is a range other than the X-range set in the correlation information file in FIG. 7. The implantation range 81 and the non-implantation range 82 may vary depending on a size of the wafer processing surface WS in the first direction (x-direction) at a position in the second direction (y-direction) on the wafer processing surface WS. In a case where a whole range in the first direction (x-direction) of one of the division regions 86 is the implantation range 81, the non-implantation range 82 may not be set in the one of the division regions 86. In the example illustrated in FIG. 10, only the implantation range 81 is set in each of the division regions 86d to 86f, and the non-implantation range 82 is not set. On the other hand, both the implantation range 81 and the non-implantation range 82 are set in the division regions 86a to 86c.

Figure 11:
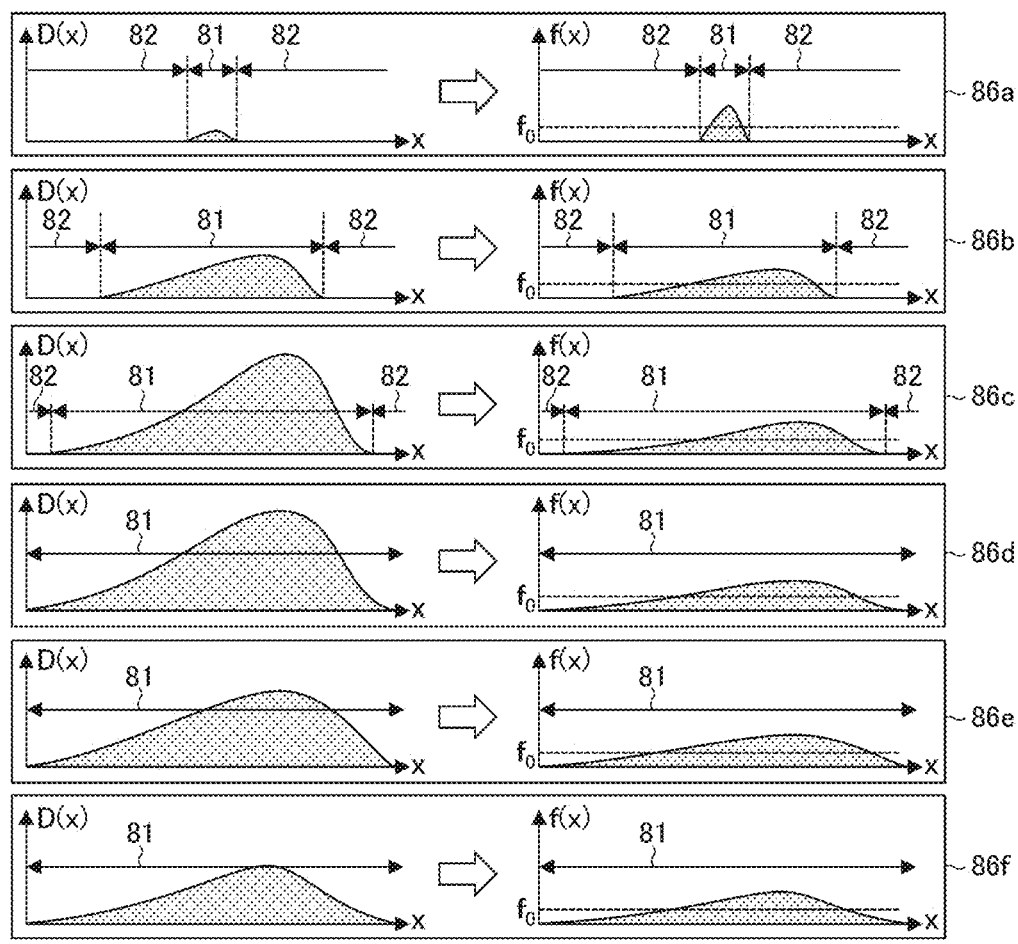
FIG. 11 is a diagram illustrating an example of a plurality of normalized initial functions.

FIG. 11 is a diagram illustrating an example of the plurality of normalized initial functions f(x). The plurality of initial functions f(x) are generated for the respective of the plurality of division regions 86, and are generated by normalizing the plurality of one-dimensional non-uniform dose distributions D(x). For example, 31 initial functions f(x) are generated corresponding to the 31 division regions 86. FIG. 11 illustrates the initial functions f(x) generated in the six division regions 86a to 86f which are the same as those in FIG. 10.

The initial functions f(x) are functions respectively proportional to the one-dimensional non-uniform dose distributions D(x) serving as the bases. A proportional coefficient between one of the one-dimensional non-uniform dose distributions D(x) and a related one of the initial functions f(x) corresponds to the above-described correction coefficient k, and a relationship that D(x)=k·f(x) is satisfied. A value of the correction coefficient k may vary for each of the plurality of division regions 86. The value of the correction coefficient k is determined when the initial function f(x) is generated.

The initial function f(x) is determined so that a maximum value or an average value of the initial functions f(x) or an integral value obtained by integrating the initial functions f(x) in the first direction (x-direction) becomes a predetermined value. For example, the initial function f(x) is determined so that the average value of the initial functions f(x) in the implantation range 81 becomes a predetermined value $f_0$. For example, when the range of the implantation range 81 is defined as $(x_1 \leq x \leq x_2)$, the initial function f(x) is determined so that the integral value ∫f(x)dx of the initial function f(x) in the implantation range 81 becomes equal to a value of $f_0 \cdot (x_2 - x_1)$. That is, the initial function f(x) is determined so that Equation 1 below is satisfied.

Equation 1

$$\int_{x_1}^{x_2} f(x)dx = f_0 \cdot (x_2 - x_1) \quad (1)$$

Subsequently, functions similar to each other out of the plurality of initial functions f(x) are aggregated, and the plurality of aggregate functions g(x) whose number is smaller than the number of the plurality of initial functions f(x) are generated. As an example, approximately 5 to 10 aggregate functions g(x) are generated by aggregating 31 initial functions f(x). The new preparation unit 68 prepares a function list in which the initial functions f(x) to be aggregated are listed, and two functions $f_A(x)$ and $f_B(x)$ which have closest similarity out of the plurality of functions f(x) included in the function list are selected. The new preparation unit 68 generates a new function (also referred to as an aggregate function g(x)) by averaging the two selected functions $f_A(x)$ and $f_B(x)$. The new preparation unit 68 deletes the two selected functions $f_A(x)$ and $f_B(x)$ from the function list, and registers the newly generated aggregate function g(x) in the function list. In this manner, the number of the functions included in the function list is reduced by one.

The new preparation unit 68 reduces the number of the functions included in the function list by repeatedly aggregate the functions included in the function list. In second and subsequent aggregate processes, there may be a case where one of the initial functions f(x) and another of the initial functions f(x) are aggregated, a case where one of the initial functions f(x) and one of the aggregate functions g(x) are aggregated, or a case where one of the aggregate functions g(x) and another of the aggregate functions g(x) are aggregated. The aggregate process is repeatedly performed until a predetermined condition is satisfied. For example, the aggregate process is repeatedly performed until the number of the functions included in the function list is equal to or smaller than a predetermined number (for example, 10), or until the functions similar to each other are no longer included in the function list. A final function list includes the plurality of aggregate functions g(x). The final function list may include the initial function f(x) that has not been subjected to the aggregate process. The number of the functions finally included in the final function list may be equal to or smaller than half the initial number of the initial functions f(x).

The new preparation unit 68 calculates an index indicating the similarity between any two functions out of the plurality of functions included in the function list, and identifies a combination of the two functions having the closest similarity. The new preparation unit 68 may evaluate the similarity, based on a standard deviation of a difference $f_1(x) - f_2(x)$ between any two functions $f_1(x)$ and $f_2(x)$, or may evaluate the similarity, based on a distance metric α between the any two functions $f_1(x)$ and $f_2(x)$. For example, the distance metric α is expressed by Equation 2 below.

Equation 2

$$\alpha = \sqrt{\frac{\int_{x_1}^{x_2} [f_1(x) - f_2(x)]^2 dx}{x_2 - x_1}} \quad (2)$$

Figure 12:
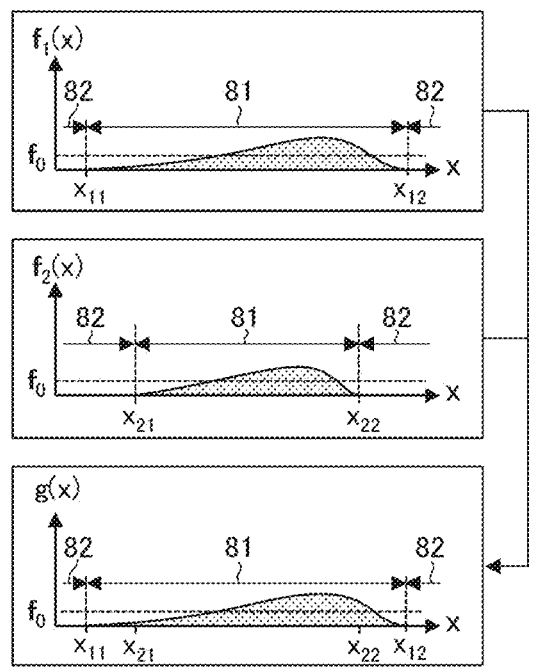
FIG. 12 is a diagram illustrating an example of functions before and after aggregation.

FIG. 12 is a diagram illustrating an example of the functions before and after the aggregation, and illustrates the two functions $f_1(x)$ and $f_2(x)$ before the aggregation and the aggregate function g(x) after the aggregation. In a case where the new preparation unit 68 evaluates the similarity between the two functions $f_1(x)$ and $f_2(x)$, the new preparation unit 68 may evaluate the similarity, based on function shapes in a range where the implantation ranges 81 of the two functions $f_1(x)$ and $f_2(x)$ overlap each other. As illustrated, in a case where the implantation range 81 $(x_{21} \leq x \leq x_{22})$ of the second function $f_2(x)$ is smaller than the implantation range 81 $(x_{11} \leq x \leq x_{12})$ of the first function $f_1(x)$, that is, in a case of $x_{11} < x_{21}$ and $x_{22} < x_{12}$, the new preparation unit 68 may evaluate the similarity between the two functions $f_1(x)$ and $f_2(x)$ in the implantation range 81 $(x_{21} \leq x \leq x_{22})$ of the second function $f_2(x)$. Specifically, the new preparation unit 68 may calculate a distance function α between the two functions $f_1(x)$ and $f_2(x)$ in the implantation range 81 of the second function f2(x), and may evaluate the similarity between the two functions $f_1(x)$ and $f_2(x)$, based on the calculated value.

In a case where the two similar functions $f_1(x)$ and $f_2(x)$ are aggregated, the new preparation unit 68 may average the two similar functions $f_1(x)$ and $f_2(x)$ in a range where the implantation ranges 81 of the two similar functions $f_1(x)$ and $f_2(x)$ overlap each other, and may adopt only values of one of the two similar functions $f_1(x)$ and $f_2(x)$ in a range where the implantation ranges 81 do not overlap each other. As illustrated, in the range $(x_{21} \leq x \leq x_{22})$ where the implantation ranges 81 of the two functions $f_1(x)$ and $f_2(x)$ overlap each other, values of the aggregate function g(x) are set to be average values $(f_1(x) + f_2(x))/2$ of the two functions. On the other hand, in the ranges where the implantation ranges 81 of the two functions $f_1(x)$ and $f_2(x)$ do not overlap each other, more specifically, in the ranges (that is, $x_{11} \leq x < x_{21}$, $x_{22} < x \leq x_{12}$) which are the implantation range 81 of the first function $f_1(x)$ and the non-implantation ranges 82, values of the aggregate function g(x) are set to be values of the first function $f_1(x)$. In this way, the aggregate function g(x) is calculated by aggregating the two functions $f_1(x)$ and $f_2(x)$.

The implantation range 81 is also set for the aggregate function g(x). The implantation range 81 of the aggregate function g(x) is a range set as the implantation range 81 in at least one of the two functions $f_1(x)$ and $f_2(x)$ serving as the bases. In the example illustrated in FIG. 12, the implantation range 81 $(x_{11} \leq x \leq x_{12})$ of the first function f1(x) becomes the implantation range 81 of the aggregate function g(x). An outside of the implantation range 81 of the aggregate function g(x) can be set as the non-implantation range 82. In a case where the whole range of the aggregate function g(x) becomes the implantation range 81, the non-implantation range 82 may not be set for the aggregate function g(x).

An aggregate number n is set for the aggregate function g(x). The aggregate number n corresponds to the number of the initial functions f(x) serving as the bases for generating the aggregate function g(x). For example, in a case where two of the initial functions f(x) are aggregated to generate the aggregate function g(x), the aggregate number n becomes 2. The aggregate number n of the initial function f(x) is 1, and the aggregate number n of the aggregate function g(x) is a sum of the aggregate numbers of the two aggregated functions. For example, in a case where a first aggregate function $g_1(x)$ having an aggregate number $n_1$ and a second aggregate function $g_2(x)$ having an aggregate number $n_2$ are aggregated to generate a third aggregate function $g_3(x)$, an aggregate number $n_3$ of the third aggregate function $g_3(x)$ becomes $n_1+n_2$.

The aggregate number n may be used for weighting when the similarity between two functions to be aggregated is evaluated or when the two functions are averaged and aggregated. For example, in a case where the first aggregate function $g_1(x)$ having the aggregate number $n_1$ and the second aggregate function $g_2(x)$ having the aggregate number $n_2$ are aggregated to generate the third aggregate function $g_3(x)$, an equation that $g_3(x)=\{n_1 \cdot g_1(x)+n_2 \cdot g_2(x)\}/(n_1+n_2)$ can be adopted.

In a process of aggregating the plurality of initial functions f(x), the new preparation unit 68 generates the correlation information file that associates the plurality of functions included in the function list with the plurality of division regions 86. In the correlation information file before the aggregate process is performed, each of the initial functions f(x) is correspondingly associated with each of the plurality of division regions 86. When the new preparation unit 68 performs the aggregate process, the new preparation unit 68 associates the aggregate function after the aggregate process with each of the division regions with which the two functions before the aggregate process are respectively associated. The correlation information file is updated every when the aggregate process is performed. In this manner, any one of the plurality of aggregate functions after the aggregate process is complete is associated with any one of the plurality of division regions 86.

The simulation unit 69 simulates the ion implantation, based on the prepared aggregate functions and the correlation information file, and calculates the estimated pattern of the two-dimensional non-uniform dose distribution on the wafer processing surface WS. The simulation unit 69 estimates the beam current density distributions in the first direction (x-direction) at the implantation position C while assuming that the beam scanning unit 32 is operated based on the aggregate functions g(x). The simulation unit 69 estimates the beam current density distributions in view of a response characteristic of the beam scanning unit 32. For example, the simulation unit 69 generates scanning voltage parameters to instruct the beam scanning unit 32, based on the aggregate functions g(x), inputs the scanning voltage parameters into a simulator simulating the responses of the beam scanning unit 32, and acquires beam scan speed distributions $v_B(x)$ in the first direction (x-direction) of the scan beam SB as outputs. The simulation unit 69 calculates $I/v_B(x)$, which are values reflecting the beam current density distributions, by dividing a beam current I of the ion beam by the scan speed distributions $v_B(x)$. When the simulation is performed, $I/v_B(x)$ that simulate a state closer to the actual implantation may be calculated by referring to the beam size in the first direction (x-direction).

The simulation unit 69 calculates the estimated pattern of the beam current density distribution for each of the plurality of aggregate functions. The simulation unit 69 calculates a wafer motion speed distribution $v_W(y)$ in the second direction (y-direction), based on the correction coefficient k in each of the plurality of division regions 86 determined in the correlation information. The simulation unit 69 combines the beam current density distributions $I/v_B(x)$ and the wafer motion speed distribution $v_W(y)$ with each other. In this manner, the simulation unit 69 calculates $I/(v_B(x) \cdot v_W(y))$ which are values reflecting the beam current densities of the beam incident into specific position coordinates (x, y) on the wafer processing surface WS. The simulation unit 69 calculates the beam current density at each of the plurality of lattice points 75. In this manner, the simulation unit 69 calculates the estimated pattern of the two-dimensional non-uniform dose distribution on the wafer processing surface WS. When the simulation is performed, $I/(v_B(x) \cdot v_W(y))$ that simulates the state closer to the actual implantation may be calculated by referring to the beam size in the second direction (y-direction).

The simulation unit 69 compares the calculated estimated pattern of the two-dimensional non-uniform dose distribution with the target pattern of the two-dimensional non-uniform dose distribution serving as the base of generating the aggregate functions and the correlation information, and evaluates the similarity between both of them. The simulation unit 69 may evaluate the similarity between the estimated pattern and the target pattern of the two-dimensional non-uniform dose distribution by using a method similar to that of the search unit 67. In a case where the estimated pattern and the target pattern of the two-dimensional non-uniform dose distribution are similar enough to each other, the new preparation unit 68 registers the prepared aggregate functions and correlation information in the implantation recipe, as the correction data set. Each of the plurality of prepared aggregate functions g(x) is registered in the implantation recipe, as the correction function h(x). On the other hand, in a case where the estimated pattern and the target pattern of the two-dimensional non-uniform dose distribution are not similar enough to each other, the new preparation unit 68 corrects the prepared aggregate functions and correlation information.

The new preparation unit 68 may correct the aggregate functions and the correlation information by changing the target pattern of the two-dimensional non-uniform dose distribution and repreparing the aggregate functions and the correlation information. An initial target pattern of the two-dimensional non-uniform dose distribution is set to $D_T(x, y)$, and the estimated pattern of the two-dimensional non-uniform dose distribution obtained by the simulation is set to $D_S(x, y)$. In a case where the estimated pattern $D_S(x, y)$ is not similar enough to the initial target pattern $D_T(x, y)$, a total pattern $D_N(x, y)=D_T(x, y)+m \cdot \Delta D(x, y)$ (m>0) obtained by adding a constant multiple of a difference pattern $\Delta D(x, y)=D_T(x, y)-D_S(x, y)$ between both of them to the initial target pattern is set as a new target pattern. In this manner, the aggregate functions and the correlation information are reprepared. The coefficient m for adjusting the weight of the difference pattern $\Delta D$ may be equal to 1, may be smaller than 1, or may be larger than 1. A method for repreparing the aggregate functions and the correlation information is the same as the method for preparing the aggregate functions and the correlation information based on the initial target pattern described above.

The simulation unit 69 simulates the ion implantation in accordance with the aggregate functions and the correlation information which are reprepared, and calculates the new estimated pattern of the two-dimensional non-uniform dose distribution. The simulation unit 69 compares the calculated new estimated pattern of the two-dimensional non-uniform dose distribution with the initial target pattern of the two-dimensional non-uniform dose distribution, and evaluates the similarity between both of them. In a case where the new estimated pattern of the two-dimensional non-uniform dose distribution is similar enough to the initial target pattern of the two-dimensional non-uniform dose distribution, the new preparation unit 68 registers the aggregate functions and the correlation information which are reprepared, in the implantation recipe, as the correction data set. Each of the plurality of reprepared aggregate functions g(x) is registered in the implantation recipe, as the correction function h(x). On the other hand, in a case where the estimated pattern and the target pattern of the two-dimensional non-uniform dose distribution are not similar enough to each other, the new preparation unit 68 reprepares the aggregate functions and the correlation information.

The new preparation unit 68 may repeatedly reprepare the aggregate functions and the correlation information until the new preparation unit 68 finds the correction data set for realizing the two-dimensional non-uniform dose distribution similar enough to the initial target pattern. In a case where the number of repreparation times reaches a predetermined number, the new preparation unit 68 may stop the repreparation, may output an alert, and may notify the user that the correction data set cannot be automatically prepared.

The new preparation unit 68 may repeatedly reprepare the aggregate functions and the correlation information, and may register the aggregate functions and the correlation information which correspond to the estimated pattern most similar to the initial target pattern out of a plurality of data set of the prepared aggregate functions and correlation information, as the correction data set. In this case, each of the plurality of aggregate functions g(x) corresponding to the estimated pattern most similar to the initial target pattern is registered in the implantation recipe, as the correction function h(x).

The new preparation unit 68 may perform a smoothing process on the aggregate functions g(x) before the automatically prepared aggregate functions g(x) are registered in the implantation recipe, as the correction functions h(x). The new preparation unit 68 may register the functions obtained by performing the smoothing process on the aggregate functions g(x) in the implantation recipe, as the correction functions h(x). The smoothing process is performed so that a change rates of the functions in the first direction (x-direction) are relatively small. The new preparation unit 68 may perform the smoothing process on the aggregate functions by applying any desired smoothing filter to the aggregate functions. For example, a moving average filter or a weighted average filter may be applied to the aggregate functions. The smoothing process may be performed on the aggregate functions g(x) before the simulation unit 69 performs the simulation based on the aggregate functions g(x) and the correlation information. That is, the simulation may be performed by the simulation unit 69, based on the correction functions h(x) on which the smoothing process is performed and the correlation information.

The new preparation unit 68 may repeatedly perform the smoothing process on the functions until the change rates of the functions in the first direction are smaller than a predetermined value. The new preparation unit 68 may repeatedly perform the smoothing process on the functions in accordance with the response characteristic of the beam scanning unit 32. For example, in a case where an upper limit value is set for a voltage change rate dV/dt of the control voltage of the beam scanning unit 32, the smoothing process is performed on the aggregate functions so that the change rates of the smoothed aggregate functions in the first direction do not exceed the change rate corresponding to the upper limit value of the voltage change rate.

The new preparation unit 68 may perform the smoothing process on at least one aggregate function out of the plurality of aggregate functions for realizing the target pattern of the two-dimensional non-uniform dose distribution, or may perform the smoothing process on all of the plurality of the aggregate functions. In accordance with each function shape of the plurality of aggregate functions, the processing content and/or the number of processing times of the smoothing process performed on each of the plurality of aggregate functions may vary. The new preparation unit 68 may perform the same smoothing process on each of the plurality of aggregate functions.

The new preparation unit 68 may perform the smoothing process on the aggregate functions in accordance with the beam current density distributions in the first direction (x-direction) which are actually measured when the ion beam is subject to reciprocating scanning based on the aggregate functions. The new preparation unit 68 confirms whether the beam current density distributions which are actually measured when the ion beam is subject to reciprocating scanning based on the aggregate functions have shapes similar to the aggregate functions. In a case where the actually measured beam current density distributions do not have the shapes similar to the aggregate functions, the new preparation unit 68 may generate the correction functions by performing the smoothing process on the aggregate functions. The new preparation unit 68 may confirm whether the beam current density distributions which are actually measured when the ion beam is subject to reciprocating scanning based on the smoothed correction functions have shapes similar to the smoothed correction functions. In a case where the actually measured beam current density distributions do not have the shapes similar to the smoothed correction functions, the new preparation unit 68 may further perform the smoothing process on the smoothed correction functions.

Figure 13:
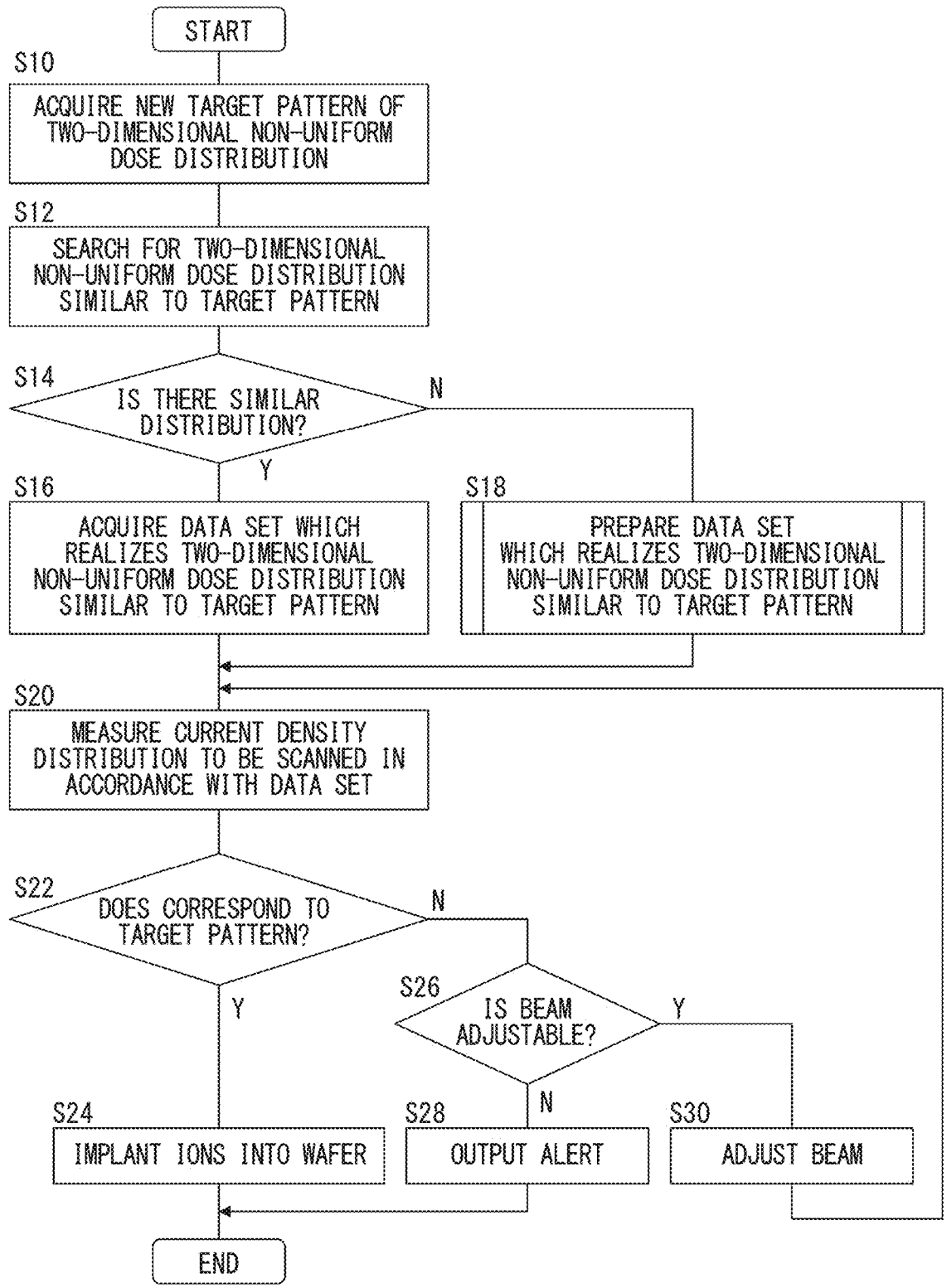
FIG. 13 is a flowchart illustrating a flow of an ion implantation method according to the embodiment.

FIG. 13 is a flowchart illustrating a flow of an ion implantation method according to the embodiment. The control device 60 acquires the new target pattern of the two-dimensional non-uniform dose distribution (S10), and searches for the implantation recipe including the two-dimensional non-uniform dose distribution similar to the new target pattern (S12). In a case where there is the implantation recipe including the two-dimensional non-uniform dose distribution similar enough to the target pattern (Y in S14), the control device 60 acquires the correction data set for realizing the two-dimensional non-uniform dose distribution similar to the target pattern (S16). In a case where there is no implantation recipe including the two-dimensional non-uniform dose distribution similar enough to the target pattern (N in S14), the control device 60 prepares the correction data set for realizing the two-dimensional non-uniform dose distribution similar to the target pattern (S18).

The control device 60 performs scanning with the ion beam in accordance with the correction data set, and acquires the beam current density distributions which are actually measured when the ion beam is subject to reciprocating scanning (S20). In a case where the actually measured beam current density distributions correspond to the two-dimensional non-uniform dose distribution serving as the target pattern (Y in S22), the ions are implanted into the wafer in accordance with the correction data set (S24). In a case where the actually measured beam current density distributions do not correspond to the two-dimensional non-uniform dose distribution serving as the target pattern (N in S22) and the ion beam is adjustable (Y in S26), the ion beam is adjusted (S30), and processes in S20 to S22 are repeatedly performed. In S30, for example, the control device 60 can adjust the ion beam to reduce the beam size, and/or can adjust the ion beam to reduce the beam current. In a case where the beam is not adjustable in S26 (N in S26), the control device 60 outputs an alert (S28).

Figure 14:
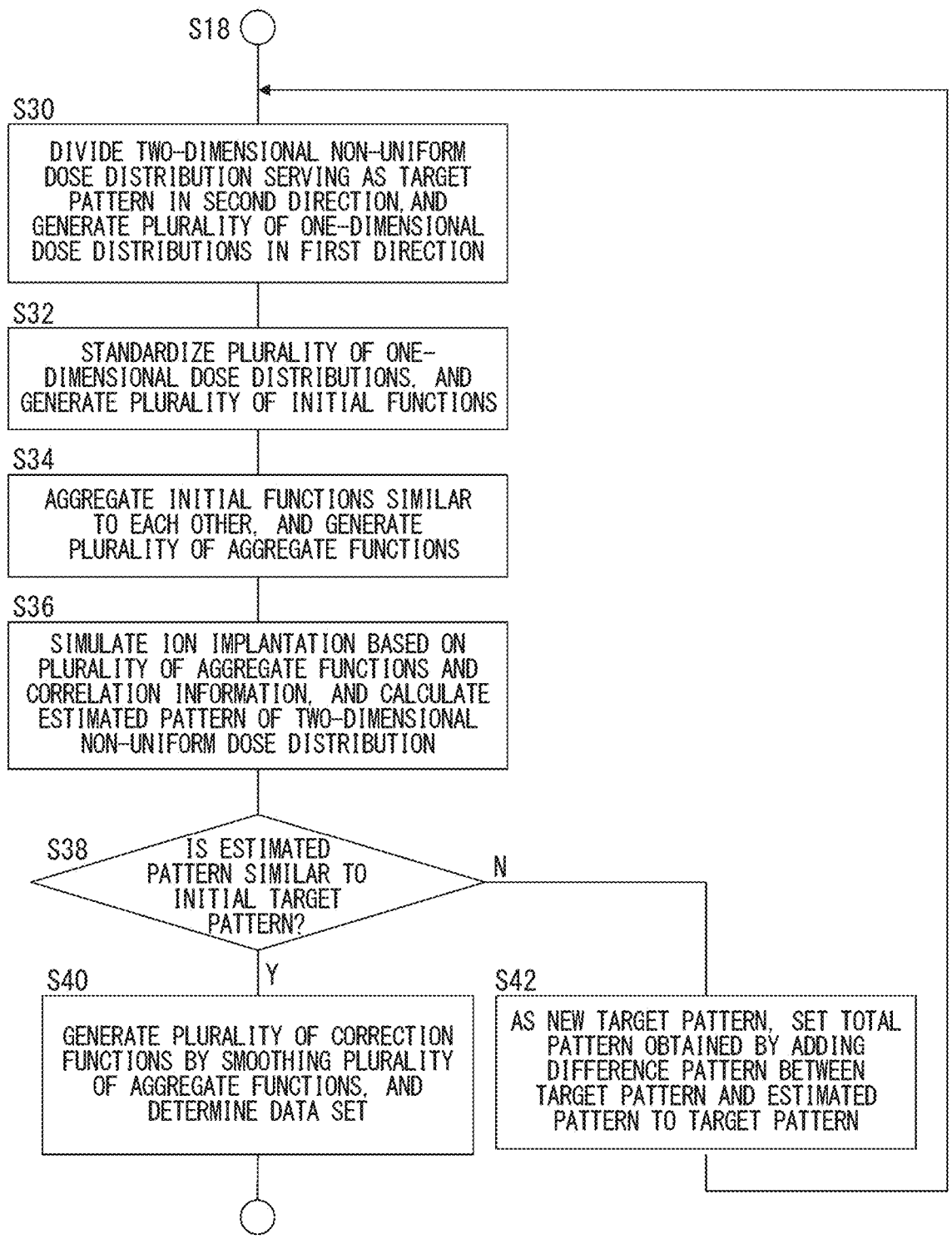
FIG. 14 is a flowchart illustrating a flow of a data set preparation process.

FIG. 14 is a flowchart illustrating a flow of a data set preparation process in S18 of FIG. 13. The control device 60 divides the two-dimensional non-uniform dose distribution serving as the target pattern in the second direction (y-direction), and generates the plurality of one-dimensional dose distributions D(x) in the first direction (x-direction) (S30). The control device 60 normalizes the plurality of one-dimensional dose distributions D(x) to generate the plurality of initial functions f(x) (S32). The control device 60 aggregates the initial functions f(x) similar to each other to generate the plurality of aggregate functions g(x) (S34). The control device 60 simulates the ion implantation based on the plurality of aggregate functions g(x) and the correlation information, and calculates the estimated pattern $D_S(x, y)$ of the two-dimensional non-uniform dose distribution (S36). In a case where the calculated estimated pattern $D_S(x, y)$ is similar enough to the initial target pattern $D_T(x, y)$ (Y in S38), the smoothing process is performed according to need on the plurality of aggregate functions g(x) to generate the plurality of correction functions h(x), and the correction data set is determined (S40). In a case where the calculated estimated pattern $D_S(x, y)$ is not similar enough to the initial target pattern $D_T(x, y)$ (N in S38), the total pattern $D_N(x, y)$ obtained by adding the constant multiple of the difference pattern $\Delta D(x, y)$ between the target pattern and the estimated pattern to the target pattern is set as the new target pattern (S42), and processes in S30 to S38 are repeatedly performed.

The control device 60 may collectively apply the methods illustrated in FIGS. 13 and 14 to a plurality of wafers included in the same lot. In this manner, it is possible to perform the ion implantation processes for realizing the two-dimensional non-uniform dose distributions which have different target patterns for respective lots. Even in a case where the target patterns are different for the respective lots, respectively similar recipes are identified from the past implantation recipes. In this manner, it is possible to omit the work for newly preparing the correction data set. Even in a case where there is no similar recipe in the past implantation recipes, the correction data set can be automatically prepared. Accordingly, it is possible to omit the work for manually preparing the correction data set. In this manner, even in a case where the non-uniform implantation is performed so that an optimal two-dimensional non-uniform dose distribution is realized for each lot, it is possible to reduce man-hours needed to carry out the preparation work for the non-uniform implantations, and it is possible to improve the productivity of the ion implanter 10.

The control device 60 may individually apply the methods illustrated in FIGS. 13 and 14 to each of the plurality of wafers included in the same lot. In this manner, it is possible to perform the ion implantation processes for realizing the two-dimensional non-uniform dose distributions which have different target patterns for respective wafers. In a case where the target pattern varies for each wafer, compared to a case where the target pattern varies for each lot, man-hours needed to carryout the preparation work for the non-uniform implantations may significantly increase. However, according to the present embodiment, the correction data set is automatically identified, or the new correction data set is automatically prepared. Accordingly, it is possible to significantly reduce man-hours needed to carryout the preparation work for the non-uniform implantations required for respective wafers. In this manner, it is possible to improve the productivity of the ion implanter 10.

According to the present embodiment, it is easy to realize an optimal non-uniform implantation for each lot or for each wafer. Therefore, the variations in the device characteristics which are attributable to the manufacturing process other than the ion implantation process are properly and easily corrected by the non-uniform implantation. In this manner, it is possible to greatly contribute to improving a yield of semiconductor devices without excessively degrading the productivity of the ion implanter 10.

Hitherto, the present invention has been explained with reference to the above-described respective embodiments. However, the present invention is not limited to the above-described respective embodiments. Those in which configurations of the respective embodiments are appropriately combined or replaced with each other are also included in the present invention. Based on the knowledge of those skilled in the art, the respective embodiments can be combined with each other, the processing sequences can be appropriately rearranged, or various modifications such as design changes can be added to the embodiment. The embodiment having the alteration s can also be included in the scope of the present invention.

Certain aspects according to the present embodiment are as follows.

Aspect 1-1

There is provided an ion implanter including a beam generator that generates an ion beam, a beam scanner that performs reciprocating scan with the ion beam in a first direction, a platen driving device that performs reciprocating motion of a wafer in a second direction perpendicular to the first direction, while holding the wafer so that a wafer processing surface is irradiated with the ion beam subject to the reciprocating scan, and a control device that changes a beam scan speed in the first direction and a wafer motion speed in the second direction in accordance with a beam irradiation position in the first direction and the second direction at which the wafer processing surface is irradiated with the ion beam so that ions having a desired two-dimensional non-uniform dose distribution are implanted into the wafer processing surface.

The control device stores a plurality of implantation recipes, and each of the plurality of recipes includes a two-dimensional non-uniform dose distribution on the wafer processing surface, a plurality of correction functions determined based on a plurality of one-dimensional dose distributions in the first direction at a plurality of positions different in the second direction on the wafer processing surface, and correlation information associating the two-dimensional non-uniform dose distribution and the plurality of correction functions with each other.

In a case where the control device acquires a target pattern of the two-dimensional non-uniform dose distribution, the control device identifies the implantation recipe including the two-dimensional non-uniform dose distribution similar to the target pattern, from the plurality of implantation recipes.

Based on the plurality of correction functions and the correlation information which are included in the identified implantation recipe, the control device changes the beam scan speed in the first direction and the wafer motion speed in the second direction, and implants the ions having the two-dimensional non-uniform dose distribution similar to the target pattern, into the wafer processing surface.

Aspect 1-2

In the ion implanter according to Aspect 1-1, the two-dimensional non-uniform dose distribution included in each of the plurality of implantation recipes is defined by data associating positions of a plurality of lattice points and doses with each other on the wafer processing surface.

The control device compares the respective doses at the plurality of lattice points with each other, and evaluates similarity between the respective two-dimensional non-uniform dose distributions.

Aspect 1-3

In the ion implanter according to Aspect 1-2, the control device evaluates the similarity, based on a standard deviation of differences between the respective doses at the plurality of lattice points.

Aspect 1-4

In the ion implanter according to Aspect 1-2 or Aspect 1-3, the control device converts the target pattern of the two-dimensional non-uniform dose distribution into data associating the positions of the plurality of lattice points and the doses with each other, and evaluates the similarity between the respective two-dimensional non-uniform dose distributions.

Aspect 1-5

In the ion implanter according to any one of Aspect 1-1 to Aspect 1-4, each of the plurality of implantation recipes further includes a beam condition which provides ion species, energy, a beam current, and a beam size of the ion beam.

The control device acquires at least a part of the beam condition together with the target pattern of the two-dimensional non-uniform dose distribution, and identifies the implantation recipe including the two-dimensional non-uniform dose distribution similar to the target pattern, from the implantation recipes corresponding to the acquired at least a part of beam condition.

Aspect 1-6

In the ion implanter according to any one of Aspect 1-1 to Aspect 1-4, each of the plurality of implantation recipes further includes a beam condition which provides ion species, energy, a beam current, and a beam size of the ion beam.

The control device determines at least a part of the beam condition, based on the target pattern of the two-dimensional non-uniform dose distribution, and identifies the implantation recipe including the two-dimensional non-uniform dose distribution similar to the target pattern, from the implantation recipes corresponding to the determined at least a part of beam condition.

Aspect 1-7

The ion implanter according to anyone of Aspect 1-1 to Aspect 1-6 further includes a beam measurement device capable of measuring beam current density distributions of the ion beam in the first direction at an implantation position at which the wafer processing surface is located during an ion implantation.

Before the ions are implanted into the wafer processing surface, the control device confirms whether the plurality of beam current density distributions measured by the beam measurement device have shapes similar to the target pattern of the two-dimensional non-uniform dose distribution when the reciprocating scan is performed with the ion beam, based on each of the plurality of correction functions included in the identified implantation recipe.

Aspect 1-8

The ion implanter according to Aspect 1-7 further includes a beam focusing/defocusing device for adjusting a beam size of the ion beam.

In a case where at least one of the beam current density distributions measured by the beam measurement device has a shape not similar to the target pattern of the two-dimensional non-uniform dose distribution when the reciprocating scan is performed with the ion beam, based on at least one of the plurality of correct functions included in the identified implantation recipe, the control device adjusts a parameter of the beam focusing/defocusing device to reduce the beam size of the ion beam.

Aspect 1-9

In the ion implanter according to Aspect 1-7 or Aspect 1-8, in a case where at least one of the beam current density distributions measured by the beam measurement device has a shape not similar to the target pattern of the two-dimensional non-uniform dose distribution when the reciprocating scan is performed with the ion beam, based on at least one of the plurality of correct functions included in the identified implantation recipe, the control device adjusts a parameter of the beam generator to reduce a beam current of the ion beam.

Aspect 1-10

In the ion implanter according to any one of Aspect 1-1 to Aspect 1-9, the two-dimensional non-uniform dose distribution included in at least one of the plurality of implantation recipes is determined, based on an actually measured pattern of the doses on the wafer processing surface when the ion implanter has implanted the ions into the wafer processing surface in accordance with the at least one of the plurality of implantation recipes.

Aspect 1-11

In the ion implanter according to any one of Aspect 1-1 to Aspect 1-10, the two-dimensional non-uniform dose distribution included in at least one of the plurality of implantation recipes is determined, based on an actually measured pattern of the doses on the wafer processing surface when another ion implanter different from the ion implanter has implanted the ions into the wafer processing surface in accordance with the at least one of the plurality of implantation recipes.

Aspect 1-12

In the ion implanter according to any one of Aspect 1-1 to Aspect 1-11, the two-dimensional non-uniform dose distribution included in at least one of the plurality of implantation recipes is determined, based on an estimated pattern of the doses on the wafer processing surface when an ion implantation has been simulated in accordance with the at least one of the plurality of implantation recipes.

Aspect 1-13

In the ion implanter according to any one of Aspect 1-1 to Aspect 1-12, the control device displays at least one of a first map indicating the target pattern of the two-dimensional non-uniform dose distribution, a second map indicating the two-dimensional non-uniform dose distribution similar to the target pattern, and a difference map indicating a difference pattern between the first map and the second map.

Aspect 1-14

In the ion implanter according to any one of Aspect 1-1 to Aspect 1-13, in a case where none of the two-dimensional non-uniform dose distributions included in the plurality of implantation recipes is similar to the target pattern, the control device newly prepares the plurality of correction functions and the correlation information for realizing the target pattern of the two-dimensional non-uniform dose distribution.

Aspect 1-15

In the ion implanter according to any one of Aspect 1-1 to Aspect 1-14, in a case where the control device acquires a plurality of target patterns of the two-dimensional non-uniform dose distributions respectively set for a plurality of wafers included in a lot, the control device identifies at least one of the implantation recipes including the two-dimensional non-uniform dose distributions similar to the plurality of target patterns, from the plurality of implantation recipes.

Based on the plurality of correction functions and the correlation information which are included in the identified at least one of the implantation recipes, the control device changes the beam scan speed in the first direction and the wafer motion speed in the second direction, and implants the ions having the two-dimensional non-uniform dose distributions similar to the plurality of target patterns respectively, into the wafer processing surfaces of the plurality of wafers.

Aspect 1-16

In the ion implanter according to any one of Aspect 1-1 to Aspect 1-14, in a case where the control device acquires each of a plurality of target patterns of the two-dimensional non-uniform dose distributions set for each of a plurality of wafers included in a lot, the control device identifies each of the implantation recipes including each of the two-dimensional non-uniform dose distributions similar to each of the plurality of target patterns, from the plurality of implantation recipes.

Based on the plurality of correction functions and the correlation information which are included in the each implantation recipe identified for each of the plurality of wafers, the control device changes the beam scan speed in the first direction and the wafer motion speed in the second direction, and implants the ions having each of the two-dimensional non-uniform dose distributions similar to each of the plurality of target patterns, into the wafer processing surface of each of the plurality of wafers.

Aspect 1-17

There is provided an ion implantation method using the ion implanter according to any one of Aspect 1-1 to Aspect 1-16. The ion implantation method includes acquiring a target pattern of the two-dimensional non-uniform dose distribution on the wafer processing surface, identifying the implantation recipe including the two-dimensional non-uniform dose distribution similar to the target pattern from the plurality of implantation recipes, and changing the beam scan speed in the first direction and the wafer motion speed in the second direction, and implanting the ions having the two-dimensional non-uniform dose distribution similar to the target pattern, into the wafer processing surface, based on the plurality of correction functions and the correlation information which are included in the identified implantation recipe.

Other aspects according to the present embodiment are as follows.

Aspect 2-1

There is provided an ion implanter including a beam generator that generates an ion beam, a beam scanner that performs reciprocating scan with the ion beam in a first direction, a platen driving device that performs reciprocating motion of a wafer in a second direction perpendicular to the first direction, while holding the wafer so that a wafer processing surface is irradiated with the ion beam subject to the reciprocating scan, and a control device that changes a beam scan speed in the first direction and a wafer motion speed in the second direction in accordance with a beam irradiation position in the first direction and the second direction at which the wafer processing surface is irradiated with the ion beam so that ions having a desired two-dimensional non-uniform dose distribution are implanted into the wafer processing surface.

In a case where the control device acquires a target pattern of the two-dimensional non-uniform dose distribution on the wafer processing surface, the control device generates a plurality of aggregate functions determined based on one-dimensional dose distributions in the first direction at a plurality of positions different in the second direction on the wafer processing surface, and correlation information associating the target pattern of the two-dimensional non-uniform dose distribution and the plurality of aggregate functions with each other, based on the target pattern.

The control device calculates an estimated pattern of the two-dimensional non-uniform dose distribution on the wafer processing surface when an ion implantation is simulated based on the plurality of aggregate functions and the correlation information, and generates a plurality of correction functions by modifying the plurality of aggregate functions so that the estimated pattern becomes similar to the target pattern, based on the estimated pattern.

Based on the plurality of correction functions and the correlation information, the control device changes the beam scan speed in the first direction and the wafer motion speed in the second direction, and implants the ions having the two-dimensional non-uniform dose distribution similar to the target pattern, into the wafer processing surface.

Aspect 2-2

In the ion implanter according to Aspect 2-1, the control device divides the target pattern of the two-dimensional non-uniform dose distribution in the second direction to generate a plurality of one-dimensional non-uniform dose distributions in the first direction respectively in a plurality of regions divided in the second direction on the wafer processing surface.

The control device generates a plurality of initial functions corresponding to the plurality of one-dimensional non-uniform dose distributions, and aggregates the initial functions which are similar to each other so as to generate a plurality of aggregate functions, the number of which is smaller than that of the plurality of initial functions.

Aspect 2-3

In the ion implanter according to Aspect 2-2, the control device generates the plurality of initial functions by normalizing the plurality of one-dimensional non-uniform dose distributions so that a maximum value of each of the plurality of initial functions, an average value of each of the plurality of initial functions, or an integral value obtained by integrating each of the plurality of initial functions in the first direction becomes a predetermined value.

Aspect 2-4

In the ion implanter according to Aspect 2-2 or Aspect 2-3, the plurality of initial functions are defined over a beam scan range including an implantation range in which the wafer processing surface is located and a non-implantation range in which over-scanning is performed with the ion beam in the first direction beyond the wafer processing surface.

The control device aggregates the plurality of initial functions, based on similarity between each of the plurality of initial functions in the implantation range.

Aspect 2-5

In the ion implanter according to Aspect 2-4, the control device averages two or more initial functions which are similar to each other in the implantation range to aggregate the two or more initial functions into one aggregate function.

Aspect 2-6

In the ion implanter according to Aspect 2-4 or Aspect 2-5, the implantation range of each of the plurality of initial functions is variable depending on a size of the wafer processing surface in the first direction at a position in the second direction on the wafer processing surface at which each of the plurality of initial functions is generated.

In a case where the control device aggregates a first initial function and a second initial function having a implantation range smaller than that of the first initial function, the control device averages the first initial function and the second initial function at positions in the first direction where the implantation range of the first initial function and the implantation range of the second initial function overlap each other, and adopts values of the first initial function at other positions in the first direction where the implantation range of the first initial function and the non-implantation range of the second initial function overlap each other to aggregate the first initial function and the second initial function.

Aspect 2-7

In the ion implanter according to any one of Aspect 2-2 to Aspect 2-6, the control device generates a new aggregate function by aggregating the initial function and the aggregate function which are similar to each other, or by aggregating two or more of the aggregate functions which are similar to each other.

Aspect 2-8

In the ion implanter according to Aspect 2-7, the control device repeatedly aggregates the initial function and/or the aggregate function until the initial function and/or the aggregate function which are similar to each other do not exist, or until the number of the initial functions and/or the aggregate functions is equal to or less than a predetermined number.

Aspect 2-9

In the ion implanter according to any one of Aspect 2-2 to Aspect 2-8, the number of the plurality of aggregate functions is equal to or less than a half of the number of the plurality of initial functions before the aggregation.

Aspect 2-10

In the ion implanter according to any one of Aspect 2-2 to Aspect 2-9, a size in the second direction of each of the plurality of regions divided in the second direction on the wafer processing surface is equal to or smaller than a half of a beam size in the second direction of the ion beam.

Aspect 2-11

In the ion implanter according to any one of Aspect 2-1 to Aspect 2-10, the control device generates the plurality of correction functions by calculating a difference pattern between the target pattern and the estimated pattern of the two-dimensional non-uniform dose distribution, calculating a sum pattern of the target pattern and a constant multiple of the difference pattern, setting the sum pattern as a new target pattern, and newly generating the plurality of aggregate functions.

Aspect 2-12

In the ion implanter according to any one of Aspect 2-1 to Aspect 2-11, the control device calculates a newly estimated pattern of the two-dimensional non-uniform dose distribution on the wafer processing surface when the ion implantation is simulated based on the plurality of correction functions and the correlation information, and repeatedly modifies the plurality of aggregate functions so that the newly estimated pattern becomes similar to the target pattern.

Aspect 2-13

In the ion implanter according to any one of Aspect 2-1 to Aspect 2-12, the control device calculates the estimated pattern of the two-dimensional non-uniform dose distribution, based on responsiveness of a beam scan speed change by the beam scanner and responsiveness of a wafer motion speed change by the platen driving device.

Aspect 2-14

The ion implanter according to any one of Aspect 2-1 to Aspect 2-13 further includes a beam measurement device capable of measuring a beam current density distribution of the ion beam in the first direction at an implantation position at which the wafer processing surface is located during the ion implantation.

Before the ions are implanted into the wafer processing surface, the control device confirms whether the beam current density distribution measured by the beam measurement device when the reciprocating scan is performed with the ion beam, based on each of the plurality of correction functions, have a shape similar to a corresponding correction function.

Aspect 2-15

In the ion implanter according to Aspect 2-14, in a case where at least one of the beam current density distributions measured by the beam measurement device when the reciprocating scan is performed with the ion beam, based on at least one of the plurality of correction functions, does not have the shape similar to the corresponding correction function, the control device smooths the at least one of the plurality of correction functions so that a change rate in the first direction of the smoothed at least one of the plurality of correction functions becomes smaller than a predetermined value.

Aspect 2-16

In the ion implanter according to any one of Aspect 2-1 to Aspect 2-15, the control device generates the plurality of correction functions by smoothing the plurality of aggregate functions so that a change rate in the first direction of each of the plurality of smoothed aggregate functions becomes smaller than a predetermined value.

Aspect 2-17

There is provided an ion implantation method using the ion implanter according to any one of Aspect 2-1 to Aspect 2-16. The ion implantation method includes acquiring a target pattern of the two-dimensional non-uniform dose distribution on the wafer processing surface, generating a plurality of aggregate functions determined based on one-dimensional dose distributions in the first direction at a plurality of positions different in the second direction on the wafer processing surface, and correlation information associating the target pattern of the two-dimensional non-uniform dose distribution and the plurality of aggregate functions with each other, based on the target pattern, calculating an estimated pattern of the two-dimensional non-uniform dose distribution on the wafer processing surface when the ion implantation is simulated based on the plurality of aggregate functions and the correlation information, generating a plurality of correction functions by modifying the plurality of aggregate functions so that the estimated pattern becomes similar to the target pattern, based on the estimated pattern, and changing the beam scan speed in the first direction and the wafer motion speed in the second direction, and implanting the ions having the two-dimensional non-uniform dose distribution similar to the target pattern, into the wafer processing surface, based on the plurality of correction functions and the correlation information.

It should be understood that the invention is not limited to the above-described embodiment, but may be modified into various forms on the basis of the spirit of the invention. Additionally, the modifications are included in the scope of the invention.

What is claimed is:

1. An ion implanter comprising:
   a beam generator that generates an ion beam;
   a beam scanner that performs reciprocating scan with the ion beam in a first direction;
   a platen driving device that performs reciprocating motion of a wafer in a second direction perpendicular to the first direction, while holding the wafer so that a wafer processing surface is irradiated with the ion beam subject to the reciprocating scan; and
   a control device that changes a beam scan speed in the first direction and a wafer motion speed in the second direction in accordance with a beam irradiation position in the first direction and the second direction at which the wafer processing surface is irradiated with the ion beam so that ions having a desired two-dimensional non-uniform dose distribution are implanted into the wafer processing surface,
   wherein the control device stores a plurality of implantation recipes, and each of the plurality of recipes includes a two-dimensional non-uniform dose distribution on the wafer processing surface, a plurality of correction functions determined based on a plurality of one-dimensional dose distributions in the first direction at a plurality of positions different in the second direction on the wafer processing surface, and correlation information associating the two-dimensional non-uniform dose distribution and the plurality of correction functions with each other,
   wherein in a case where the control device acquires a target pattern of the two-dimensional non-uniform dose distribution, the control device identifies the implantation recipe including the two-dimensional non-uniform dose distribution similar to the target pattern, from the plurality of implantation recipes, and
   wherein based on the plurality of correction functions and the correlation information which are included in the identified implantation recipe, the control device changes the beam scan speed in the first direction and the wafer motion speed in the second direction, and implants the ions having the two-dimensional non-uniform dose distribution similar to the target pattern, into the wafer processing surface.

2. The ion implanter according to claim 1,
   wherein the two-dimensional non-uniform dose distribution included in each of the plurality of implantation recipes is defined by data associating positions of a plurality of lattice points and doses with each other on the wafer processing surface, and
   wherein the control device compares the respective doses at the plurality of lattice points with each other, and evaluates similarity between the respective two-dimensional non-uniform dose distributions.

3. The ion implanter according to claim 2,
   wherein the control device evaluates the similarity, based on a standard deviation of differences between the respective doses at the plurality of lattice points.

4. The ion implanter according to claim 2,
   wherein the control device converts the target pattern of the two-dimensional non-uniform dose distribution into data associating the positions of the plurality of lattice points and the doses with each other, and evaluates the similarity between the respective two-dimensional non-uniform dose distributions.

5. The ion implanter according to claim 1,
   wherein each of the plurality of implantation recipes further includes a beam condition which provides ion species, energy, a beam current, and a beam size of the ion beam, and
   wherein the control device acquires at least a part of the beam condition together with the target pattern of the two-dimensional non-uniform dose distribution, and identifies the implantation recipe including the two-dimensional non-uniform dose distribution similar to the target pattern, from the implantation recipes corresponding to the acquired at least a part of beam condition.

6. The ion implanter according to claim 1,
   wherein each of the plurality of implantation recipes further includes a beam condition which provides ion species, energy, a beam current, and a beam size of the ion beam, and
   wherein the control device determines at least a part of the beam condition, based on the target pattern of the two-dimensional non-uniform dose distribution, and identifies the implantation recipe including the two-dimensional non-uniform dose distribution similar to the target pattern, from the implantation recipes corresponding to the determined at least a part of beam condition.

7. The ion implanter according to claim 1, further comprising:
   a beam measurement device capable of measuring beam current density distributions of the ion beam in the first direction at an implantation position at which the wafer processing surface is located during an ion implantation,
   wherein before the ions are implanted into the wafer processing surface, the control device confirms whether the plurality of beam current density distributions measured by the beam measurement device have shapes similar to the target pattern of the two-dimensional non-uniform dose distribution when the reciprocating scan is performed with the ion beam, based on each of the plurality of correction functions included in the identified implantation recipe.

8. The ion implanter according to claim 7, further comprising:
a beam focusing/defocusing device for adjusting a beam size of the ion beam,
wherein in a case where at least one of the beam current density distributions measured by the beam measurement device has a shape not similar to the target pattern of the two-dimensional non-uniform dose distribution when the reciprocating scan is performed with the ion beam, based on at least one of the plurality of correct functions included in the identified implantation recipe, the control device adjusts a parameter of the beam focusing/defocusing device to reduce the beam size of the ion beam.

9. The ion implanter according to claim 7,
wherein in a case where at least one of the beam current density distributions measured by the beam measurement device has a shape not similar to the target pattern of the two-dimensional non-uniform dose distribution when the reciprocating scan is performed with the ion beam, based on at least one of the plurality of correct functions included in the identified implantation recipe, the control device adjusts a parameter of the beam generator to reduce a beam current of the ion beam.

10. The ion implanter according to claim 1,
wherein the two-dimensional non-uniform dose distribution included in at least one of the plurality of implantation recipes is determined, based on an actually measured pattern of the doses on the wafer processing surface when the ion implanter has implanted the ions into the wafer processing surface in accordance with the at least one of the plurality of implantation recipes.

11. The ion implanter according to claim 1,
wherein the two-dimensional non-uniform dose distribution included in at least one of the plurality of implantation recipes is determined, based on an actually measured pattern of the doses on the wafer processing surface when another ion implanter different from the ion implanter has implanted the ions into the wafer processing surface in accordance with the at least one of the plurality of implantation recipes.

12. The ion implanter according to claim 1,
wherein the two-dimensional non-uniform dose distribution included in at least one of the plurality of implantation recipes is determined, based on an estimated pattern of the doses on the wafer processing surface when an ion implantation has been simulated in accordance with the at least one of the plurality of implantation recipes.

13. The ion implanter according to claim 1,
wherein the control device displays at least one of a first map indicating the target pattern of the two-dimensional non-uniform dose distribution, a second map indicating the two-dimensional non-uniform dose distribution similar to the target pattern, and a difference map indicating a difference pattern between the first map and the second map.

14. The ion implanter according to claim 1,
wherein in a case where none of the two-dimensional non-uniform dose distributions included in the plurality of implantation recipes is similar to the target pattern, the control device newly prepares the plurality of correction functions and the correlation information for realizing the target pattern of the two-dimensional non-uniform dose distribution.

15. The ion implanter according to claim 1,
wherein in a case where the control device acquires a plurality of target patterns of the two-dimensional non-uniform dose distributions respectively set for a plurality of wafers included in a lot, the control device identifies at least one of the implantation recipes including the two-dimensional non-uniform dose distributions similar to the plurality of target patterns, from the plurality of implantation recipes, and
wherein based on the plurality of correction functions and the correlation information which are included in the identified at least one of the implantation recipes, the control device changes the beam scan speed in the first direction and the wafer motion speed in the second direction, and implants the ions having the two-dimensional non-uniform dose distributions similar to the plurality of target patterns respectively, into the wafer processing surfaces of the plurality of wafers.

16. The ion implanter according to claim 1,
wherein in a case where the control device acquires each of a plurality of target patterns of the two-dimensional non-uniform dose distributions set for each of a plurality of wafers included in a lot, the control device identifies each of the implantation recipes including each of the two-dimensional non-uniform dose distributions similar to each of the plurality of target patterns, from the plurality of implantation recipes, and
wherein based on the plurality of correction functions and the correlation information which are included in the each implantation recipe identified for each of the plurality of wafers, the control device changes the beam scan speed in the first direction and the wafer motion speed in the second direction, and implants the ions having each of the two-dimensional non-uniform dose distributions similar to each of the plurality of target patterns, into the wafer processing surface of each of the plurality of wafers.

17. An ion implantation method using the ion implanter according to claim 1, comprising:
acquiring a target pattern of the two-dimensional non-uniform dose distribution on the wafer processing surface;
identifying the implantation recipe including the two-dimensional non-uniform dose distribution similar to the target pattern from the plurality of implantation recipes; and
changing the beam scan speed in the first direction and the wafer motion speed in the second direction, and implanting the ions having the two-dimensional non-uniform dose distribution similar to the target pattern, into the wafer processing surface, based on the plurality of correction functions and the correlation information which are included in the identified implantation recipe.

* * * * *